US008855155B2

(12) United States Patent
Lutgen et al.

(10) Patent No.: US 8,855,155 B2
(45) Date of Patent: Oct. 7, 2014

(54) SEMICONDUCTOR LASER LIGHT SOURCE

(75) Inventors: Stephan Lutgen, Dresden (DE); Stefan Groetsch, Lengfeld-Bad Abbach (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 69 days.

(21) Appl. No.: 13/579,209

(22) PCT Filed: Mar. 21, 2011

(86) PCT No.: PCT/EP2011/054239
§ 371 (c)(1),
(2), (4) Date: Oct. 29, 2012

(87) PCT Pub. No.: WO2011/117185
PCT Pub. Date: Sep. 29, 2011

(65) Prior Publication Data
US 2013/0039374 A1 Feb. 14, 2013

(30) Foreign Application Priority Data
Mar. 24, 2010 (DE) .......................... 10 2010 012 604

(51) Int. Cl.
*H01S 3/04* (2006.01)
*H01S 5/00* (2006.01)
*H01S 5/022* (2006.01)
*H04N 9/31* (2006.01)
*H01S 5/0683* (2006.01)
*H01S 5/40* (2006.01)
*G02B 6/42* (2006.01)
*G02B 26/08* (2006.01)

(52) U.S. Cl.
CPC ........... *H01S 5/02288* (2013.01); *H01S 5/0683* (2013.01); *H01S 5/02292* (2013.01); *H01S 5/4087* (2013.01); *H01S 5/0071* (2013.01); *H04N 9/3161* (2013.01); *G02B 6/4214* (2013.01); *H01S 5/4012* (2013.01); *H01S 5/02212* (2013.01); *G02B 26/0833* (2013.01)

USPC ...................... 372/43.01; 372/50.12

(58) Field of Classification Search
CPC ........................ H01S 5/02288; H01S 5/4012
USPC ............................. 372/43.01, 50.12
See application file for complete search history.

(56) References Cited

U.S. PATENT DOCUMENTS

| 5,262,636 A | 11/1993 | Rink |
| 6,810,057 B1 | 10/2004 | Itoh et al. |

(Continued)

FOREIGN PATENT DOCUMENTS

| CN | 101442185 A | 5/2009 |
| DE | 20 2004 013 003 U1 | 2/2005 |

(Continued)

OTHER PUBLICATIONS

Inari, T., et al., "A Proximity Sensor Using Power Variation of a Laser Diode Caused by Returned Light and its Characteristics of Stability," Industrial Electronics Society, IECON 2005, Nov. 6, 2005, pp. 2114-2118.

(Continued)

*Primary Examiner* — Armando Rodriguez
(74) *Attorney, Agent, or Firm* — Slater & Matsil, L.L.P.

(57) ABSTRACT

In at least one embodiment of the semiconductor laser light source, the latter includes a carrier and at least two semiconductor lasers. The semiconductor lasers are mounted on a carrier top. The semiconductor laser light source furthermore includes at least one optical component, which is arranged downstream of at least one of the semiconductor lasers in a direction of emission. The semiconductor lasers and the optical component are housed tightly in a common enclosure by way of a cover. The dimensions of the enclosure, viewed in three orthogonal spatial directions, amount in each case to at most 8 mm×8 mm×7 mm.

20 Claims, 16 Drawing Sheets

(56) References Cited

U.S. PATENT DOCUMENTS

| | | |
|---|---|---|
| 2005/0248008 A1 | 11/2005 | Wilson |
| 2007/0091945 A1 | 4/2007 | Ferstl |
| 2008/0144183 A1 | 6/2008 | Zhang et al. |
| 2008/0175286 A1* | 7/2008 | Kamijima ................ 372/30 |
| 2008/0273568 A1 | 11/2008 | Schulz et al. |
| 2009/0103923 A1* | 4/2009 | Hosomi et al. ............ 398/91 |
| 2009/0289950 A1 | 11/2009 | Hamano et al. |
| 2011/0140284 A1 | 6/2011 | Guenther et al. |
| 2012/0039072 A1 | 2/2012 | Lell et al. |

FOREIGN PATENT DOCUMENTS

| | | |
|---|---|---|
| DE | 10 2005 036 266 A1 | 1/2007 |
| DE | 10 2007 034 958 A1 | 11/2008 |
| DE | 10 2007 062 047 A1 | 7/2009 |
| DE | 10 2008 015 253 A1 | 9/2009 |
| DE | 10 2008 063 634 A1 | 6/2010 |
| DE | 10 2009 004 117 A1 | 7/2010 |
| EP | 0 944 049 A2 | 9/1999 |
| EP | 1 710 619 A1 | 10/2006 |
| JP | 2000-242192 A | 9/2000 |
| JP | 2009-105106 A | 5/2009 |
| JP | 2009-216789 A | 9/2009 |
| KR | 10 2008 0095412 A | 10/2008 |
| TW | 200935691 A | 8/2009 |
| TW | 201011871 A | 3/2010 |
| WO | WO 2008/156811 A1 | 12/2008 |
| WO | WO 2009/079970 A1 | 7/2009 |
| WO | WO 2010/079072 A1 | 7/2010 |

OTHER PUBLICATIONS

Schulz, W., "Mini-Projectors Soon to be Found in Mobile Phones," VDI News, No. 33, Aug. 15, 2008, 2 pages.

Stern, M., et al., "73.3: Ultra-Miniature Projector: A High Resolution, Battery Powered Laser Display," International Symposium of the Society for Information Display (SID 2006), vol. XXXVII, May 24, 2005, pp. 2015-2017.

* cited by examiner

FIG 1
A)
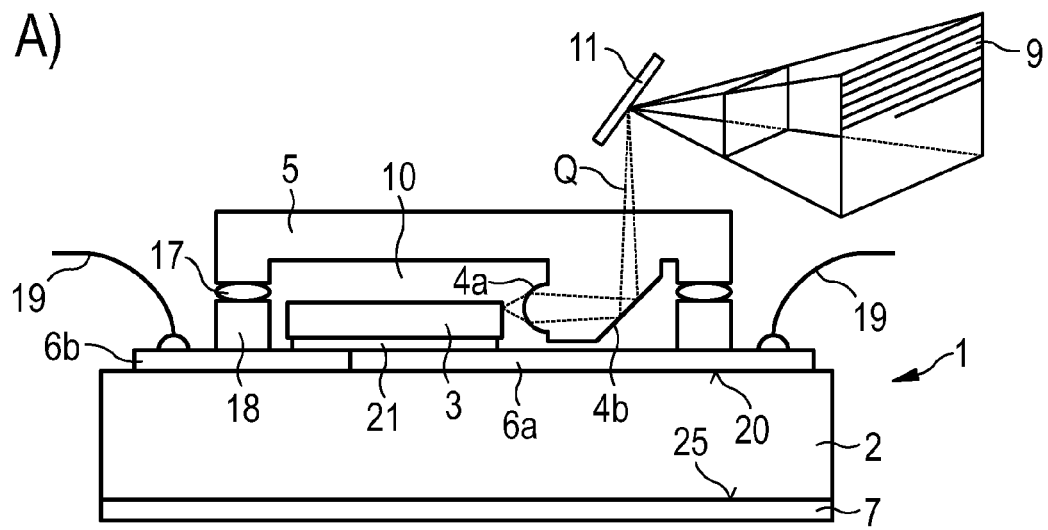
B)
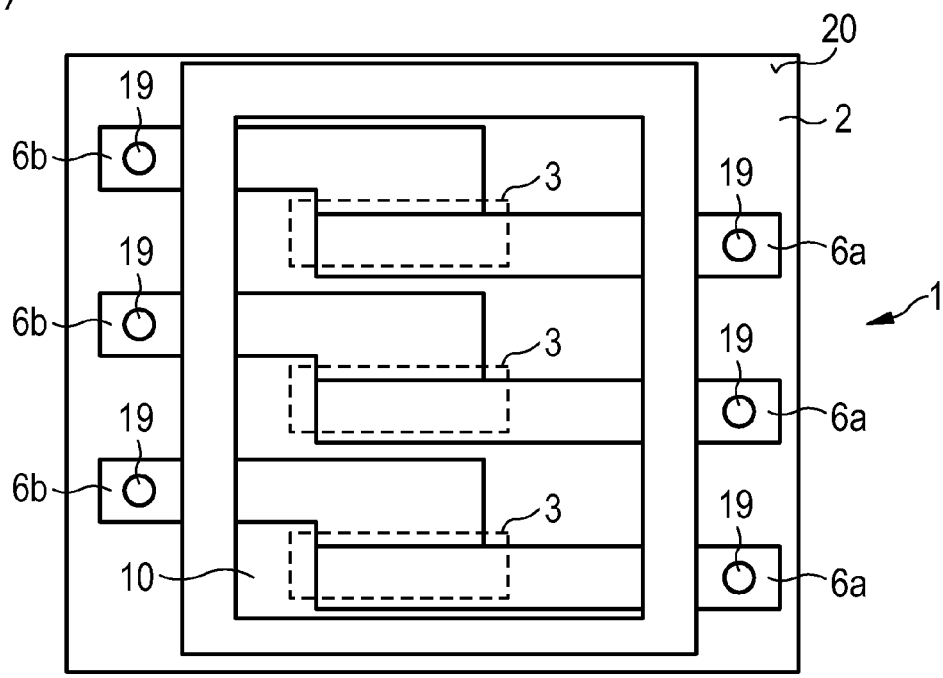

FIG 2
A)
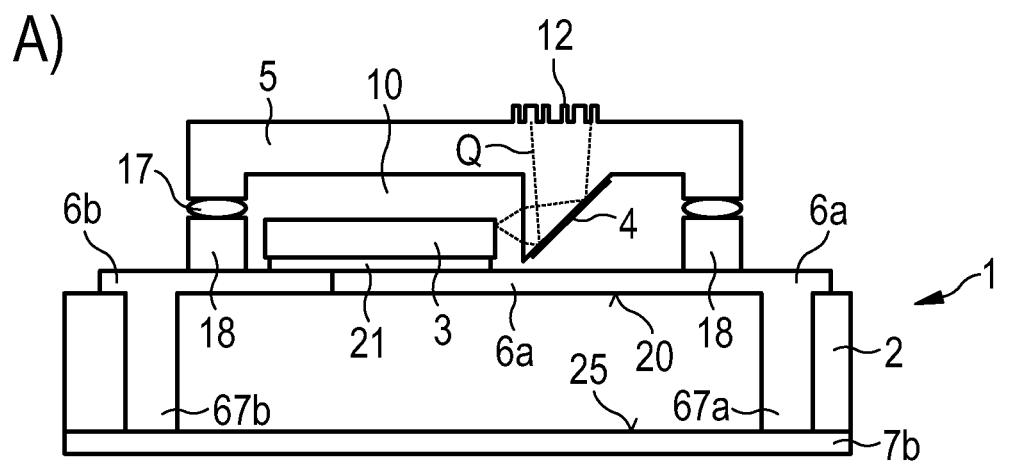
B)
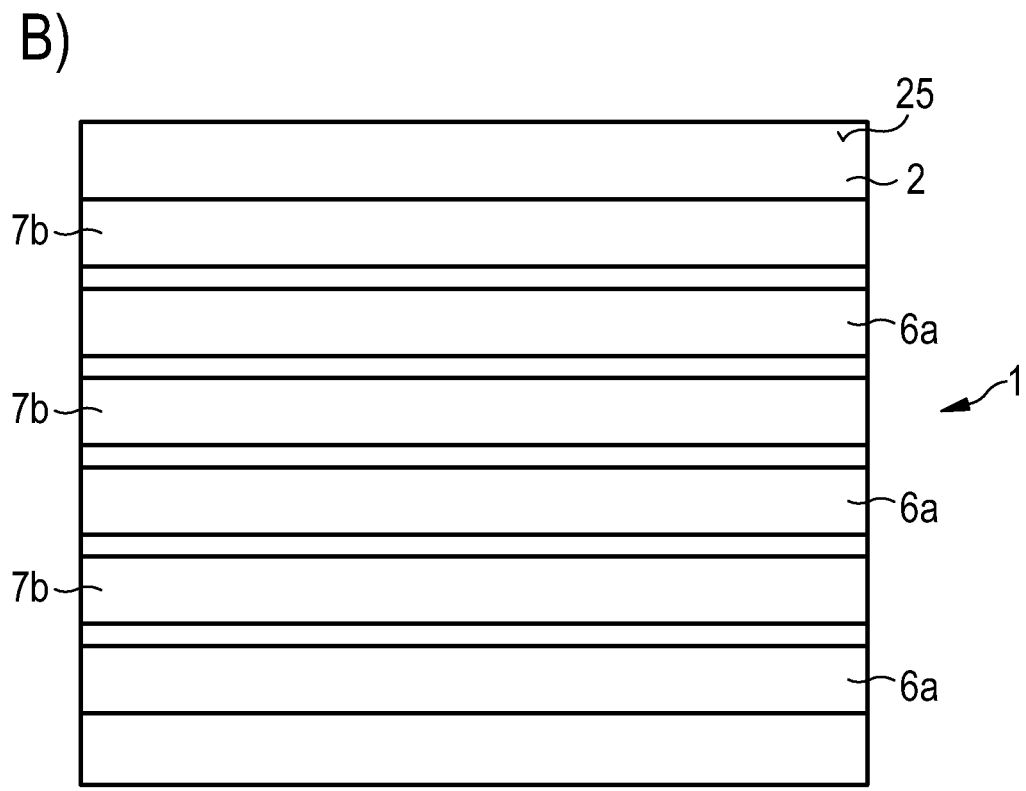

FIG 11
A)
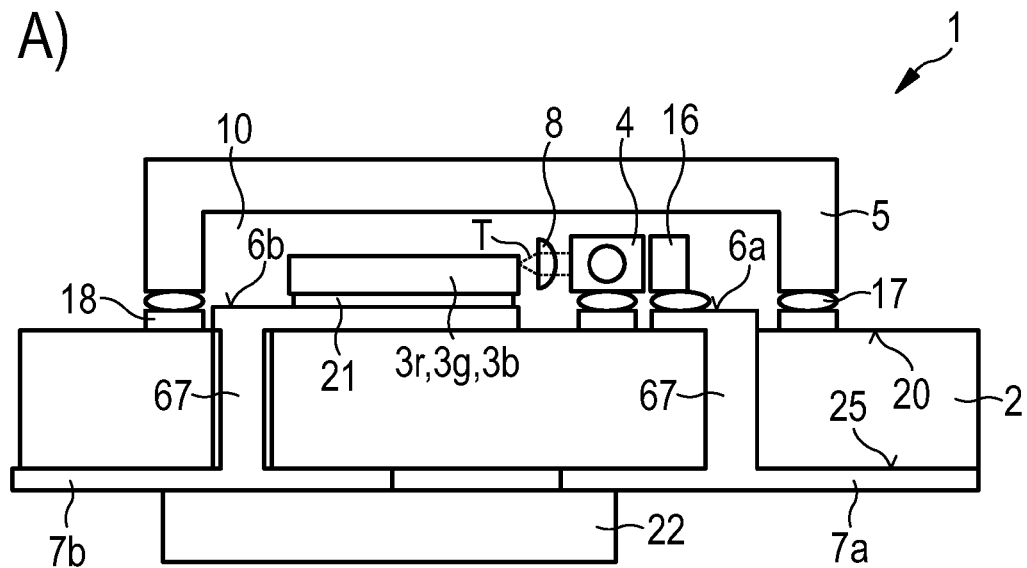
B)
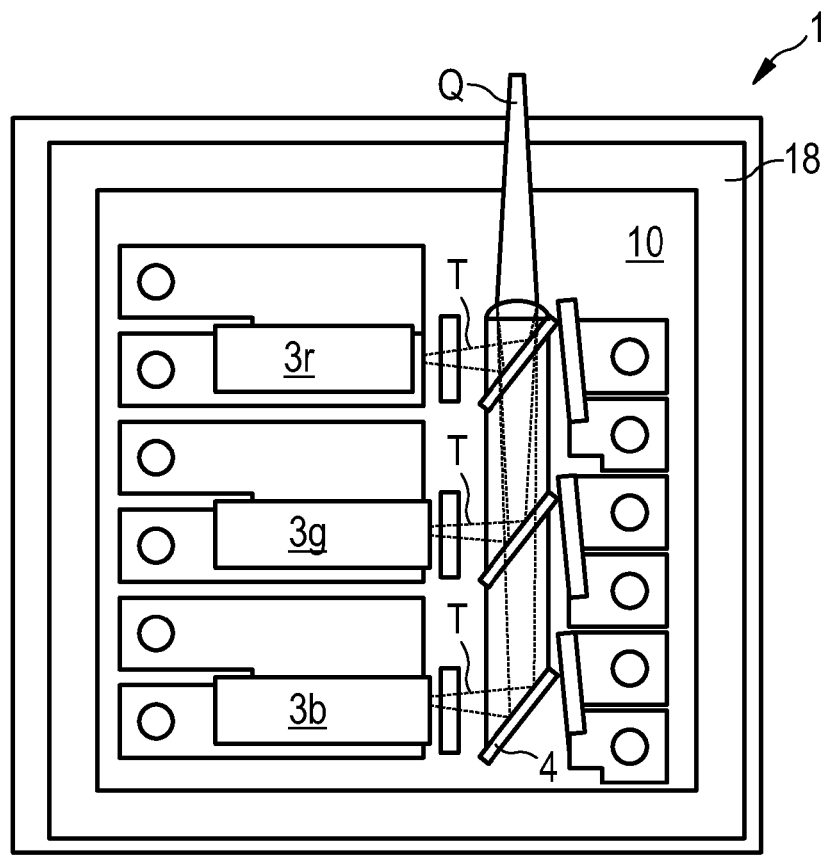

FIG 15
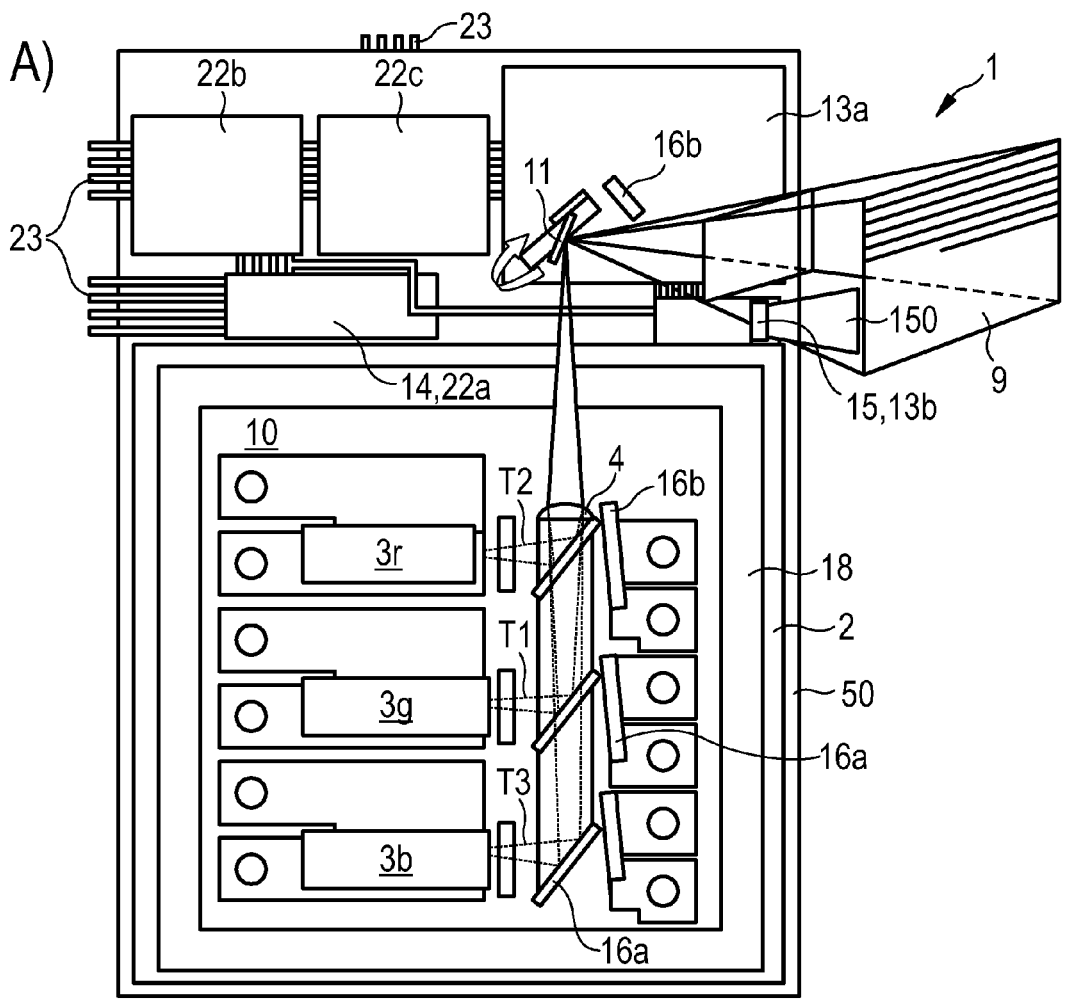
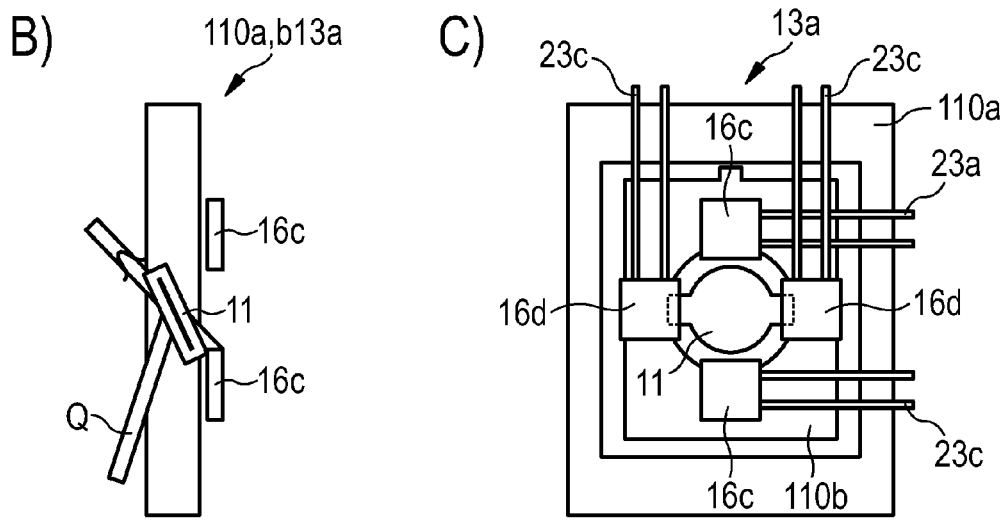

FIG 17
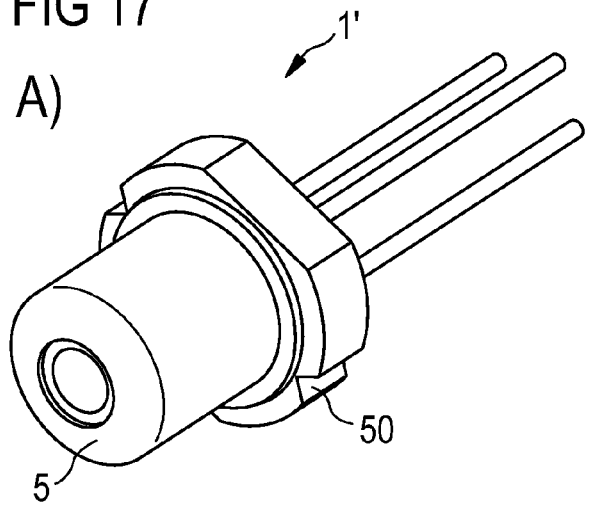
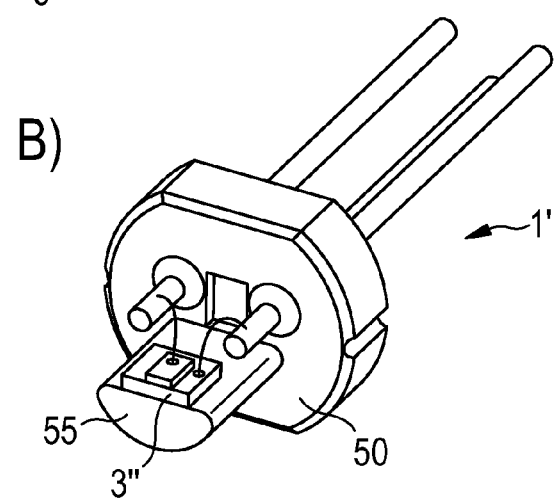
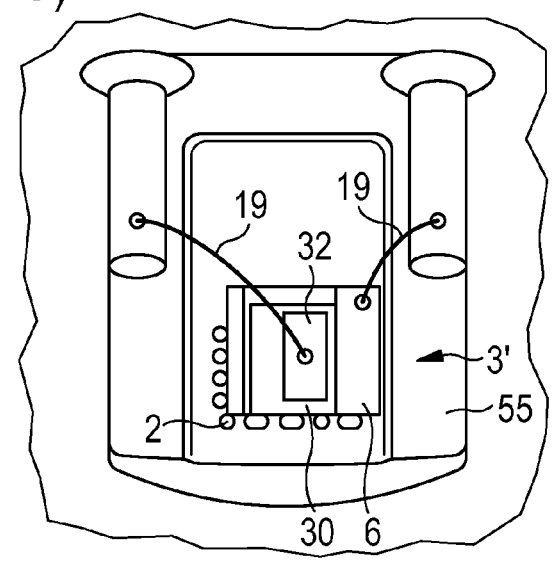

A)

FIG 20
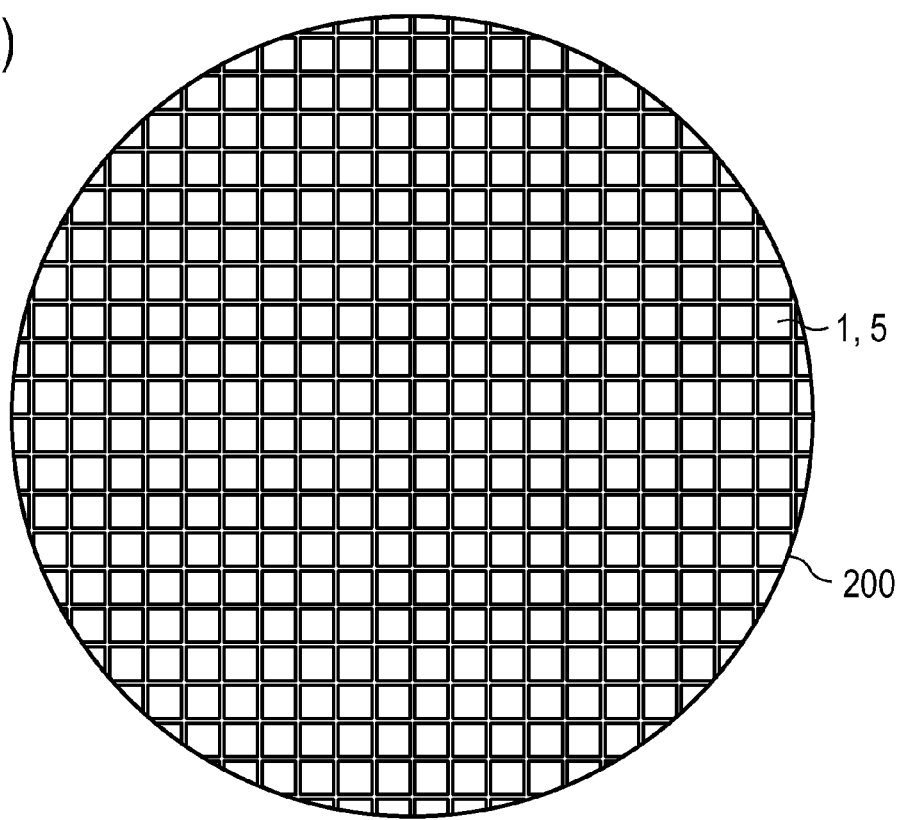
A)
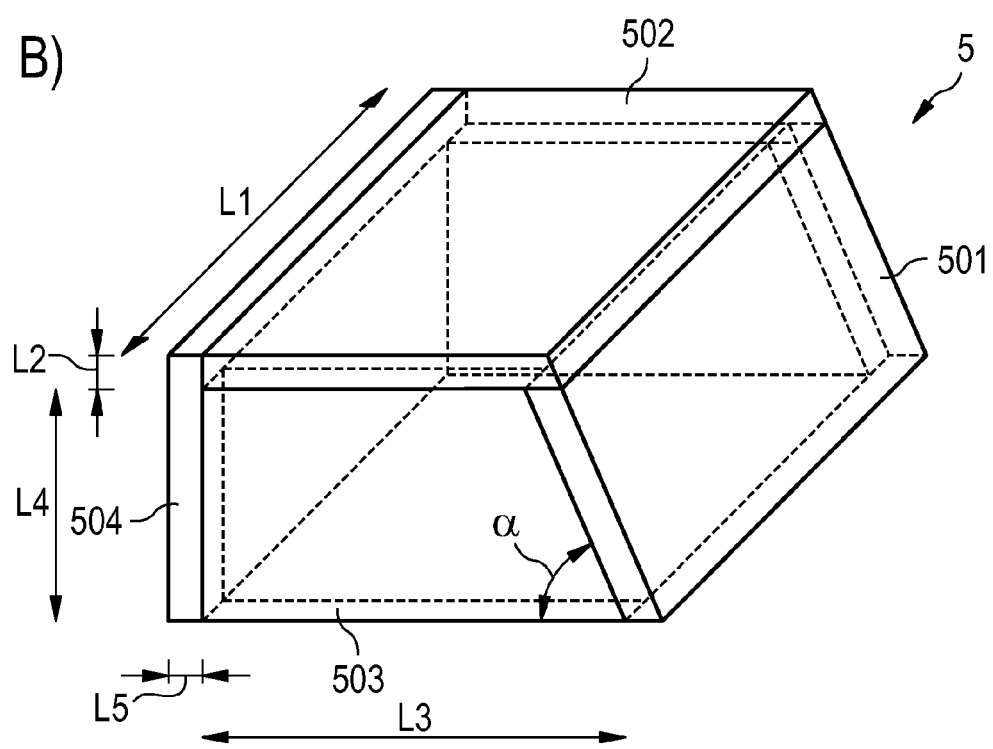
B)

SEMICONDUCTOR LASER LIGHT SOURCE

This patent application is a national phase filing under section 371 of PCT/EP2011/054239, filed Mar. 21, 2011, which claims the priority of German patent application 10 2010 012 604.7, filed Mar. 24, 2010, each of which is incorporated herein by reference in its entirety.

TECHNICAL FIELD

The present invention relates to a semiconductor laser light source.

BACKGROUND

German Patent Publication DE 10 2007 062 047 A1 discloses a compact housing.

SUMMARY OF THE INVENTION

One aspect of the invention provides a semiconductor laser light source of small geometric dimensions.

According to at least one embodiment of the semiconductor laser light source, the latter comprises a carrier with a carrier top. The carrier takes the form for example of a metal core printed circuit board or a printed circuit board. The carrier preferably exhibits an average specific thermal conductivity of at least 80 W/mK.

According to at least one embodiment of the semiconductor laser light source, the latter includes at least one or at least two semiconductor lasers, which are designed to generate visible radiation and are mounted on the carrier top of the carrier. Semiconductor laser means that the radiation emitted by the laser is generated in a semiconductor body. The term semiconductor laser preferably means that no frequency conversion stage, which converts one wavelength of radiation generated in the semiconductor body into another wavelength, is arranged downstream of the semiconductor body of the semiconductor laser. In other words, the at least one semiconductor laser is preferably a component which directly emits the desired wavelength.

According to at least one embodiment of the semiconductor laser light source, the latter comprises a semiconductor laser emitting in the red spectral range, a semiconductor laser emitting in the green spectral range and a semiconductor laser emitting in the blue spectral range. The semiconductor laser light source thus contains at least three semiconductor lasers emitting in particular directly in the corresponding spectral ranges.

According to at least one embodiment of the semiconductor laser light source, an optical component is arranged downstream of at least one of the semiconductor lasers, preferably all the semiconductor lasers together, in a direction of emission. By means of the optical component, it is in particular possible for partial beams emitted by each of the for example three semiconductor lasers of the semiconductor laser light source to be combined into a whole beam, i.e., beam combination may preferably be achieved by means of the optical component. Whole beam means in particular that all cross-sections of the partial beams overlap and that the partial beams extend in the same direction. The same direction means preferably that paired overlap of the cross-sections of the partial beams from the semiconductor laser light source as far as for example to a projection surface amounts to at least 50% or at least 75%.

According to at least one embodiment of the semiconductor laser light source, the latter comprises a cover. The cover and the carrier substantially define an enclosure. The enclosure is sealed tightly, in particular gas-tightly. Tightly means that over the service life of the semiconductor laser light source no or no significant gas exchange takes place between the interior of the enclosure and a region outside the enclosure. Tightness for the purposes of the present application may be achieved in particular in that the cover is connected by way of a metal solder, by way of a glass solder or by way of a weld seam to the carrier or to a housing frame. The enclosure is preferably evacuated or is filled with a noble gas, with nitrogen or with dried air.

According to at least one embodiment of the semiconductor laser light source, the at least one semiconductor laser, particularly preferably all the semiconductor lasers, and the optical component are located in the enclosure and are jointly housed. In other words, the above-stated components are in the immediate spatial vicinity of one another and are preferably not separated from one another by barriers of solid materials.

According to at least one embodiment of the semiconductor laser light source, the dimensions of the enclosure amount to at most 8 mm×8 mm×7 mm, in particular at most 5 mm×5 mm×4 mm, preferably at most 3 mm×3 mm×4 mm, particularly preferably at most 2.5 mm×2.5 mm×3 mm. The smallest value here indicates in particular the height above the carrier top. In other words, the enclosure may be completely surrounded by a cuboid of the stated dimensions. Alternatively or in addition, the size of the enclosure amounts at most to 400 $mm^3$, in particular at most to 100 $mm^3$, preferably at most to 30 $mm^3$, particularly preferably at most to 12 $mm^3$. Furthermore, the base area of the enclosure on the carrier top alternatively or additionally measures at most 60 $mm^2$, in particular at most 25 $mm^2$, preferably at most 10 $mm^2$, particularly preferably at most 6 $mm^2$.

In at least one embodiment of the semiconductor laser light source, the latter comprises a carrier with a carrier top and at least two semiconductor lasers, in particular in each case at least one semiconductor laser emitting in the red, at least one in the green and at least one in the blue spectral range. The semiconductor lasers are mounted on the carrier top. The semiconductor laser light source furthermore comprises at least one optical component, which is arranged downstream of at least one, preferably all of the semiconductor lasers in a direction of emission. The semiconductor lasers and the optical component are housed tightly in a common enclosure by way of a cover. The dimensions of the enclosure, viewed in three orthogonal spatial directions, amount in each case to at most 8 mm×8 mm×7 mm.

Since the dimensions of the semiconductor laser light source correspond substantially to those of the enclosure, a particularly compact semiconductor laser light source may be achieved by mounting the semiconductor laser and the optical component jointly in the enclosure. The compactness of the semiconductor laser light source may be additionally increased by various combinations of further measures. Such measures are in particular the design of the semiconductor lasers, the arrangement and development of the optical component and guidance of electrical supply lines on the carrier and the manner of contacting the semiconductor lasers.

Further components, such as an imaging unit and safety devices, may likewise be mounted compactly at least indirectly on the carrier or on the enclosure. By the various measures for making the semiconductor laser light source more compact, the latter may be used for example as a projection unit in compact, portable equipment such as mobile telephones or small computers. The semiconductor laser light source may be used in particular to generate polychromatic light, preferably white light.

According to at least one embodiment of the semiconductor laser light source, the optical component is arranged jointly and optically directly downstream of the semiconductor lasers. Optically directly downstream means that no further optically active components are located between a radiation exit face of the respective semiconductor laser and a radiation entrance face of the optical component. In particular, no lens, in particular no "fast-axis collimating lens" is mounted between the semiconductor laser and the optical component in a beam path of the partial beams emitted in each case by the semiconductor lasers. Due to the only small distance between the optical component and the semiconductor lasers, it is possible to dispense with additional lenses in addition to the optical component inside the enclosure. In this way, the compactness of the semiconductor laser light source may be increased and a particularly small enclosure achieved.

According to at least one embodiment of the semiconductor laser light source, the optical component is not designed to reduce the divergence of partial beams, which are emitted by the semiconductor lasers, or the divergence of a whole beam, which is formed by the superimposed partial beams. In other words, the optical component does not serve to focus the radiation, but instead preferably solely to combine the partial beams into the whole beam. The optical component comprises for example solely planar shaped radiation entrance faces and radiation exit faces.

According to at least one embodiment of the semiconductor laser light source, a lens which is in particular not rotationally symmetrical in shape or an optical system comprising a plurality of lenses is arranged downstream of the optical component. The lens may be mounted directly on the optical component, for example via a bonding agent or welding. Preferably, however, the optical component is mounted outside the enclosure, for example on the cover. The lens or the optical system is in particular designed to reduce the divergence of the whole beam. The ellipticity of the beam cross-section of the whole beam is preferably less than 4, in particular less than 2, depending on the lens or the optical system.

According to at least one embodiment of the semiconductor laser light source, the lens or the optical system is designed to generate a linear beam cross-section of the whole beam. The ellipticity of the beam cross-section then amounts in particular to at least 10 or at least 20. For example, the semiconductor laser light source may then be used in a scanner or in a scanning unit.

According to at least one embodiment of the semiconductor laser light source, the latter comprises at least two semiconductor lasers, which emit radiation of the same wavelength. In particular the semiconductor laser light source comprises a laser bar with a plurality of semiconductor lasers, which emit radiation at the same wavelength.

According to at least one embodiment of the semiconductor laser light source, at least two of the partial beams emitted by the semiconductor lasers are differently polarized. The optical component is then preferably a polarization-selective element, such that combining partial beams in particular of the same wavelength may proceed by exploiting the different polarizations of the partial beams.

According to at least one embodiment of the semiconductor laser light source, the cover comprises a light exit disc, which is oriented obliquely to the carrier.

An angle α between the carrier and the light exit disc is preferably between 45° and 85° inclusive.

According to at least one embodiment of the semiconductor laser light source, the latter is mechanically and/or electrically surface-mountable and/or surface-contactable. For example, the semiconductor laser light source may be attached by soldering to a mounting support by way of a carrier bottom remote from the carrier top. By way of the for example soldered joint, the semiconductor laser light source is connected mechanically and preferably thermally to the mounting support. If the carrier bottom is patterned and electrical conductor tracks are located on the carrier bottom, electrical contacting of the semiconductor laser light source may also take place at the same time as the mechanical and thermal connection. The semiconductor laser light source is contacted in particular without a bonding wire. By economising on bonding wires, the space requirement of the semiconductor laser light source may be reduced and a particularly small enclosure and low structural height may be achieved.

According to at least one embodiment of the semiconductor laser light source, one or all of the semiconductor lasers are electrically and mechanically contacted without bonding wires in the enclosure with in each case at least two electrical conductor tracks on the carrier top. Contact points for bonding wires typically have a comparatively large space requirement of around 2500 μm$^2$. The bending radii needed by bonding wires also makes a minimum component height necessary, which is markedly greater than the structural height of the semiconductor lasers themselves. Because the semiconductor lasers are contacted without bonding wires, the semiconductor laser light source may be of more compact construction and a particularly small enclosure may be achieved.

According to at least one embodiment of the semiconductor laser light source, the electrical conductor tracks are connected on the carrier top by way of vias to electrical conductor tracks on the carrier bottom. In particular, the carrier bottom is then designed for surface mounting of the semiconductor laser light source. Such conductor tracks allow space-saving construction of the semiconductor laser light source. In particular, it is possible to dispense with electrical contacting regions to external, electrical wiring on the carrier top.

According to at least one embodiment of the semiconductor laser light source, an imaging optical system are mounted on the carrier top of the carrier or on the top of an intermediate carrier on which the carrier is mounted. The imaging optical system comprise for example a micro-electromechanical mirror, or MEMS mirror for short, or a diffractive optical element, or DOE for short. A DOE comprises an optical diffraction grating and is designed in particular to produce an image which does not vary over time, for example a logo.

According to at least one embodiment of the semiconductor laser source, the latter comprises at least one proximity sensor. The proximity sensor is mounted space-savingly on the carrier top of the carrier or on the top of the intermediate carrier and is designed to detect objects in the image field of the semiconductor laser light source. In addition, the semiconductor laser light source includes safety control electronics. These are designed to reduce the output power of the semiconductor lasers as a function of a signal from the proximity sensor. With high maximum semiconductor laser output powers in particular, there is a risk of damage to the eyes of people in the image field. The risk of eye damage may be reduced by the proximity sensor in cooperation with the safety control electronics.

According to at least one embodiment of the semiconductor laser light source, the semiconductor lasers are each designed to generate a luminous flux of at least 8 lm, in particular of at least 12 lm. Alternatively or in addition, the semiconductor laser light source is designed to emit a luminous flux of at least 25 lm or at least 40 lm in total. Such high luminous fluxes may be produced by the compact structure of the semiconductor laser light source and by low thermal resistances.

According to at least one embodiment of the semiconductor laser light source, the latter comprises at least one monitor diode, which is designed to detect radiation emitted by the semiconductor lasers. The monitor diode enables active power readjustment of the semiconductor lasers, in particular colour correction of an emitted overall radiation.

Preferably the semiconductor laser light source comprises precisely one monitor diode, which is mounted indirectly or directly on the optical component. The precisely one monitor diode allows detection of a fraction of the radiation from each of the partial beams emitted by the semiconductor lasers. In other words, fractions of the radiation emitted by the semiconductor lasers are in each case guided through the optical component to the one monitor diode. Just one monitor diode allows economies of components and results in a more compact semiconductor laser light source and a particularly small enclosure.

According to at least one embodiment of the semiconductor laser light source, at least one of the semiconductor lasers comprises a semiconductor body, which comprises top face metallization on a major face remote from the carrier top. The top face metallization preferably extends at least 50% or at least 75% of the way along a longitudinal direction of the semiconductor body. The top face metallization allows current to be supplied to the semiconductor body. In this way, it is possible to dispense with additional electrical contact points on the semiconductor bodies, whereby said bodies can be of more compact structure and whereby a particularly small enclosure may be achieved.

According to at least one embodiment of the semiconductor laser light source, the top face metallization is connected conductively via a side face metallization, which is applied at least in places on a longitudinal side of the semiconductor body, to an electrical conductor track on the carrier top of the carrier. Alternatively or in addition to the side face metallization, openings may be created through the semiconductor body which are filled at least partially with an electrically conductive material and connect the top face metallization electrically conductively to a conductor track on the carrier top.

BRIEF DESCRIPTION OF THE DRAWINGS

A semiconductor laser light source described herein is explained in greater detail below by way of exemplary embodiments with reference to the drawings. Elements which are the same in the individual figures are indicated with the same reference numerals. The relationships between the elements are not shown to scale, however, but rather individual elements may be shown exaggeratedly large to assist in understanding.

FIGS. 1 to 3, 7 to 16, 18 and 19 are schematic representations of exemplary embodiments of semiconductor laser light sources described herein;

FIGS. 4 and 17 are schematic representations of modifications of semiconductor laser light sources;

FIG. 20 is a schematic representation of an exemplary embodiment of a cover for semiconductor laser light sources described herein.

DETAILED DESCRIPTION OF ILLUSTRATIVE EMBODIMENTS

Figure 3:
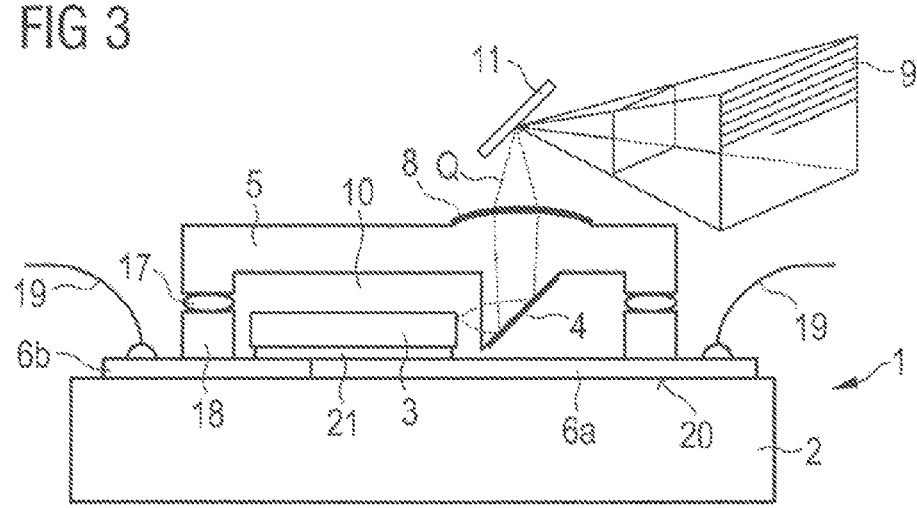

FIG. 1A is a schematic sectional representation and FIG. 1B is a schematic plan view of an exemplary embodiment of a semiconductor laser light source 1. The semiconductor laser light source 1 comprises a carrier 2 with a carrier top 20 and a carrier bottom 25 opposite thereto. Electrical conductor tracks 6a, 6b are formed on the carrier top 20 by metallization. Three semiconductor lasers 3 are mounted on in each case two of the conductor tracks 6a, 6b via a bonding agent 21. In the plan view according to FIG. 1B, the semiconductor lasers 3 are merely indicated by broken lines. The semiconductor lasers 3 each overlap partially with the conductor tracks 6a, 6b on the carrier top 25, see FIG. 1B. This overlap enables particularly space-saving contacting and a particularly compact arrangement of the semiconductor lasers 3. Furthermore, the semiconductor lasers 3 may be driven electrically separately and mutually independently. External electrical contacting of the semiconductor laser light source 1 proceeds via bonding wires 19. The bonding wires 19 are mounted outside the enclosure 10 on the conductor tracks 6a, 6b.

Metallization 7 is additionally applied to the carrier bottom 25, which metallization preferably extends over the entirety or over the majority of the carrier bottom 25 and via which the carrier 2 may be connected to an external mounting support, not shown, by way of soldering or by way of adhesive bonding. The carrier 2 preferably further exhibits high specific thermal conductivity, such that the thermal resistance between the semiconductor lasers 3 and the mounting support, not shown, is low.

A housing frame 18 is optionally mounted on the carrier top 20 via the conductor tracks 6a, 6b. A cover 5 is attached by way of a sealant 17 to the housing frame 18, which is made for example of metal or glass or with a semiconductor material such as silicon or with a plastics material. The cover 5 is transparent to the radiation generated by the semiconductor lasers 3. The sealant 17 may be a metal solder, a glass solder or a weld seam. An electrically insulating layer not shown in the figures is mounted between the conductor tracks 6a, 6b and the housing frame 18. If no housing frame 18 is present, the cover 5 is preferably mounted directly on the carrier top 20 and the conductor tracks 6a, 6b or on the electrically insulating layer, unlike in the drawing.

An enclosure 10 is surrounded in gas-tight manner by the carrier 2, the housing frame 18 and the cover 5. The enclosure 10 is filled with dried air or with nitrogen, for example. The semiconductor lasers 3 are located jointly together with an optical component 4a, 4b in the enclosure 10. The cover 5 and the optical component 4a, 4b and the micro-electromechanical mirror 11 are not shown in FIG. 1B to simplify the illustration.

The optical component 4a, 4b is attached to the cover 5. Focusing of radiation emitted by the semiconductor lasers 3 may be achieved by way of part of the optical component 4a. Beam deflection and beam combination of partial beams into a whole beam Q proceed via part of the optical component 4b. The whole beam Q is guided to an imaging unit, embodied by a micro-electromechanical mirror 11. The micro-electromechanical mirror 11 generates a time-variable image 9, such that the semiconductor laser light source 1 may be used as a projector. The image 9 is preferably generated by way of row scanning or column scanning of an image area or via Lissajous figures. It is likewise possible for the semiconductor laser light source 1 to be used as a pointing device, for instance as a laser pointer.

The base area of the enclosure 10 on the carrier top 20 has dimensions of at most 2.5 mm×2.5 mm. The height of the enclosure 10, in a direction perpendicular to the carrier top 20, amounts to at most 1.5 mm. The external dimensions of the housing frame 18 and the cover 5 exceed the internal dimensions of the enclosure 10 preferably by at most 40%, in particular at most 25%. The electrical power consumption of the semiconductor lasers 3 amounts in total for example to at least 1 W or at least 2 W. The semiconductor laser light source 1 may preferably be assembled or mounted in the panel or at wafer level, in particular using a "full wafer" process.

FIG. 2 illustrates a further exemplary embodiment of the semiconductor laser light source 1. The conductor tracks 6a, 6b on the carrier top 20 are connected to corresponding electrical conductor tracks 7a, 7b on the carrier bottom 25 by way of electrical vias 67a, 67b. The vias 67a, 67b are located next the cover 5, when the carrier top 20 is seen in plan view. The conductor tracks 7a, 7b on the carrier bottom 25, see the view from below according to FIG. 2B, resemble straight lines and extend, when viewed in a longitudinal direction, preferably over the entire carrier bottom 25, in order to ensure high thermal contact with a mounting support, not shown, in the event of surface mounting. The area of the total carrier bottom 25 occupied by the conductor tracks 7a, 7b amounts for example to more than 50% or more than 75%.

Unlike in the illustration, it is likewise possible for the semiconductor lasers 3 not to be individually drivable but rather partially or completely to be connected electrically in parallel or in series. Corresponding circuit configurations may be produced by arrangement of the conductor tracks 6a, 6b on the carrier top 20 and of the conductor tracks 7a, 7b on the carrier bottom 25.

According to FIG. 2 the optical component 4 is mounted directly on the cover 5. The imaging optical system is formed by a diffractive optical element 12. The diffractive optical element 12 comprises a diffraction grating and is designed to display an image of invariable shape over time, for example in the form of a company logo. However, the color of the image may be variable over time, by supplying current to the semiconductor laser 3 in a time-variable manner.

In the exemplary embodiment according to FIG. 3, beam deflection and beam combining is effected by the optical component 4, which is formed directly on the cover 5. A lens 8 is mounted for beam-focusing on the cover 5 outside the enclosure 10. The lens 8 and/or the optical component 4 may be in one-piece with the cover 5, as indeed in the other exemplary embodiments.

Figure 4:
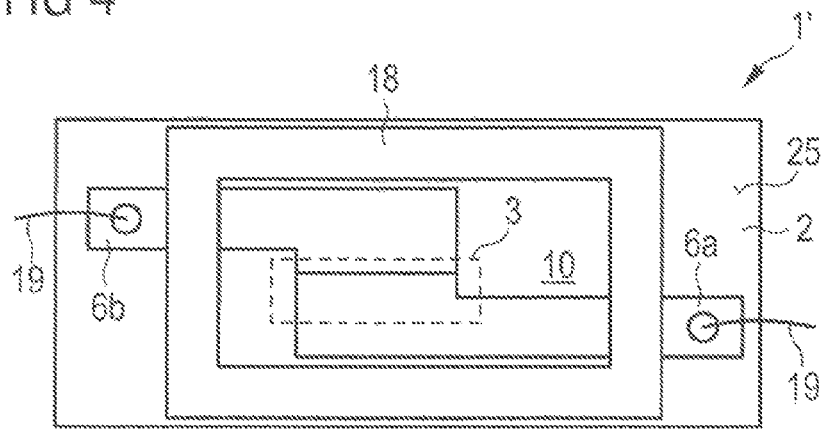

FIG. 4 shows a modification of a light source 1', in which just one semiconductor laser 3 is located in the enclosure 10. The enclosure 10 may then be made smaller and is for example at most 5 mm$^3$ or at most 2.5 mm$^3$ in size. The conductor tracks 6a, 6b and further optionally present components of the light source 1' are preferably configured in a manner similar to the illustrated exemplary embodiments of the semiconductor laser light source 1. Features of the semiconductor laser light source 1 are therefore also disclosed for the light source 1' and vice versa.

Figure 5:
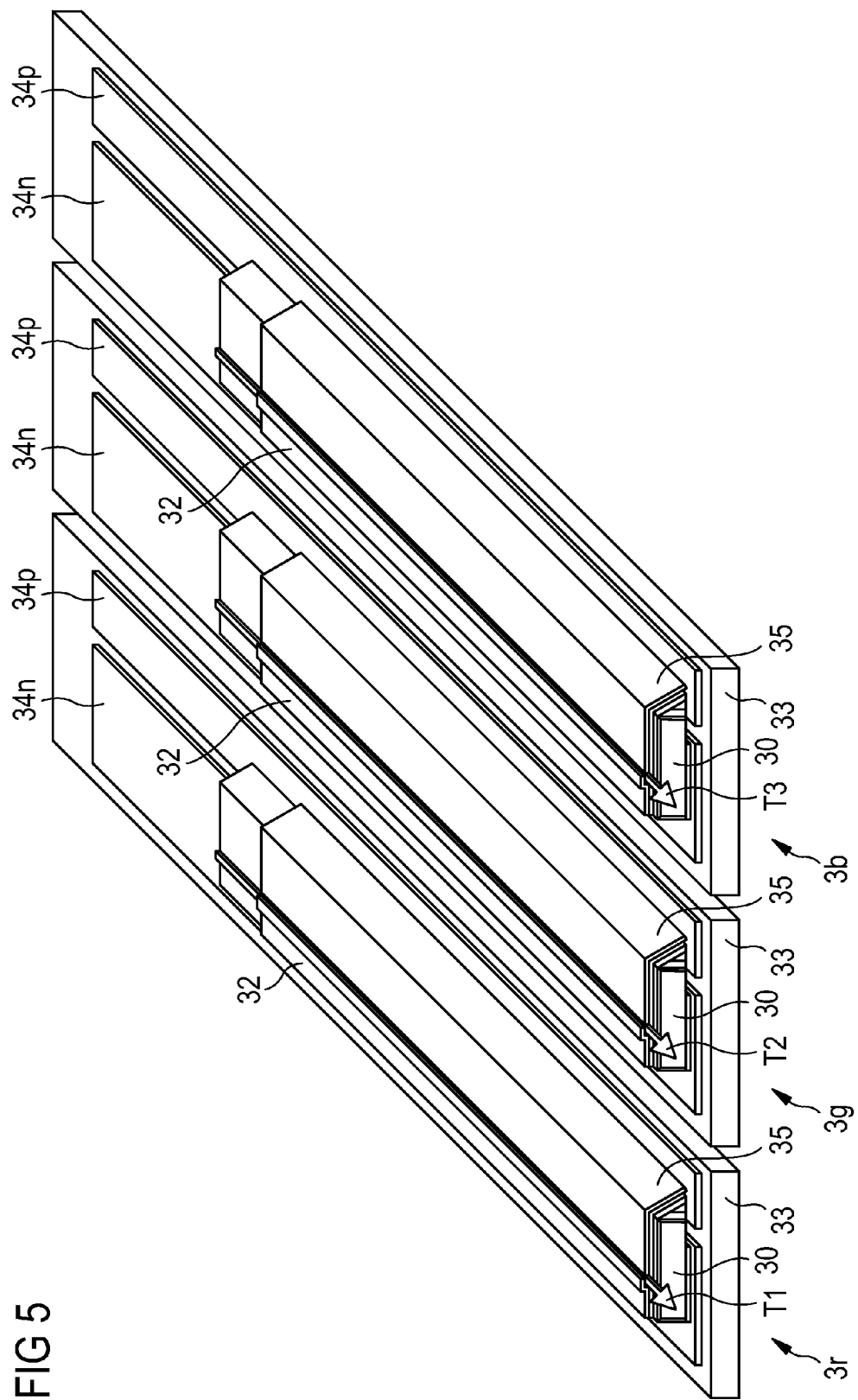
FIGS. 5 to 6 are schematic representations of exemplary embodiments of semiconductor lasers described herein.
Figure 6:
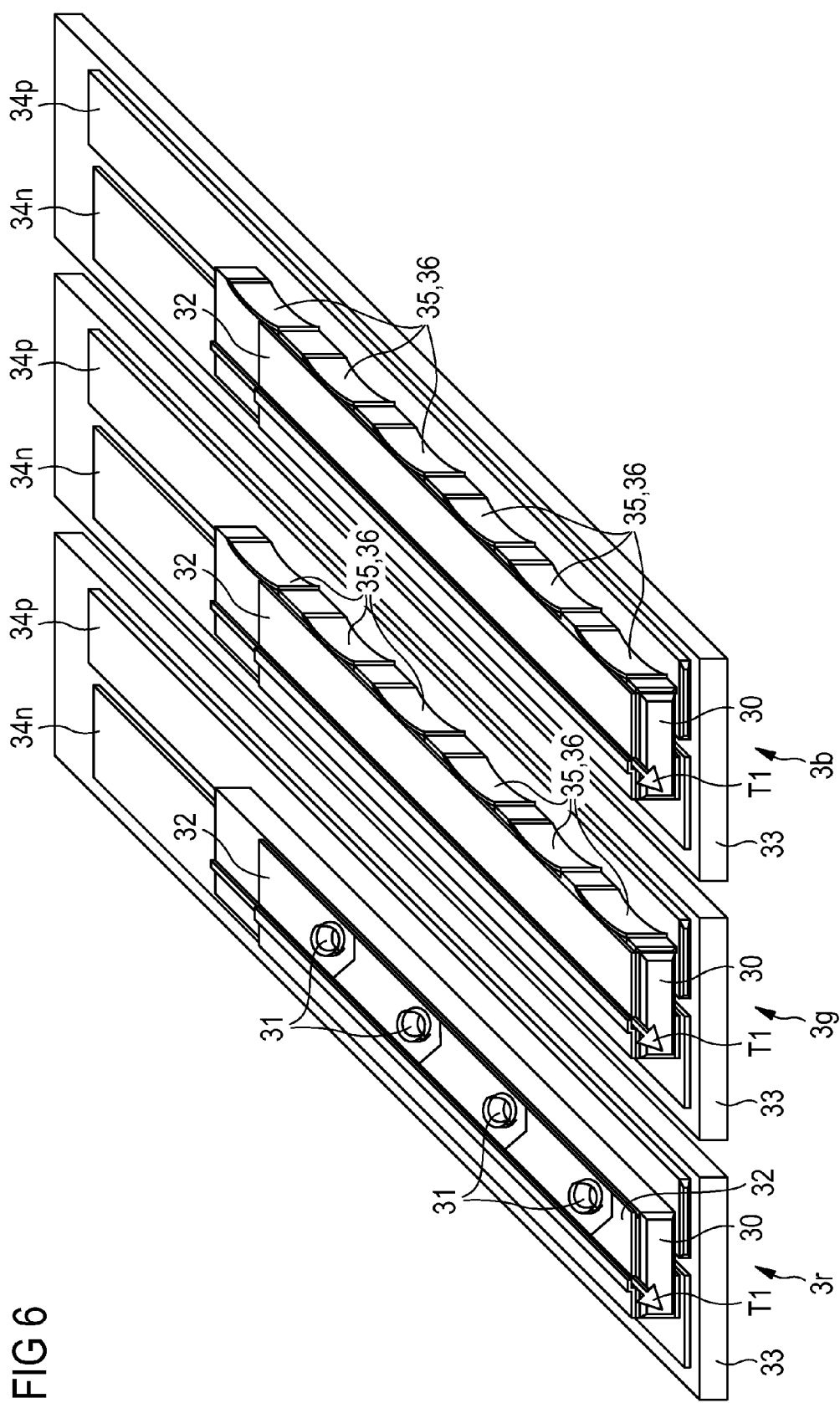

FIGS. 5 and 6 are perspective illustrations of preferred embodiments of the semiconductor lasers 3r, 3g, 3b. According to FIG. 5, the semiconductor lasers 3r, 3g, 3b each comprise a substrate 33, which is formed for example with a ceramic or consists of a ceramic. Two electrical conductor tracks 34n, 34p are formed by metallization on each of the substrates 33. Each of the semiconductor bodies 30 of the semiconductor lasers 3r, 3g, 3b is mounted on its own separate substrate 33. A semiconductor body 30 is contacted electrically in each case via the conductor tracks 34n on a side facing the substrate 33, for example by means of a solder, for instance an AuSn solder. The partial beams T1, T2, T3 emitted by the semiconductor lasers 3r, 3g, 3b are indicated by arrows.

On a side of each of the semiconductor bodies 30 remote from the substrates 33, top face metallization 32 is applied, which covers the majority of the major faces of the semiconductor bodies 30 remote from the substrates 33. Side face metallization 35 is applied to longitudinal sides of the semiconductor bodies 30, by means of which the top face metallization 32 is connected to the conductor tracks 34p. Preferably electrically insulating interlayers which are not shown are formed between the semiconductor bodies 30 and the side face metallization 35.

In the case of the semiconductor laser 3r according to FIG. 6, openings 31 are formed through the semiconductor bodies 30, the openings 31 being surrounded by semiconductor material of the semiconductor body 30 and filled at least in part with an electrically conductive material. Between this electrically conductive material and the semiconductor material, an electrically insulating interlayer, not shown in FIG. 6, is preferably located in the openings 31. The at least partially filled openings 31 provide an electrical connection from the conductor track 34p to the top face metallization 32.

In the case of the semiconductor lasers 3g, 3b, a plurality of recesses 36 are formed on longitudinal sides of the semiconductor body 30. When producing the semiconductor lasers 3g, 3b, a predetermined breaking point may be formed by these recesses 36 along the longitudinal side, along which predetermined breaking point the semiconductor bodies 30 are singulated. The side face metallization 35, which connects the top face metallization 32 electrically with the conductor tracks 34p, is applied in particular solely in the recesses 36.

The conductor tracks 34n, 34p are preferably connected electrically conductively with electrical terminal areas, not shown in FIGS. 5 and 6, on a bottom of the substrates 33 remote from the semiconductor bodies 30, such that the semiconductor lasers 3r, 3g, 3b may be mounted on the carrier top 20 of the semiconductor laser light source 1 by surface mounting, or SMT for short.

Because the semiconductor bodies 30 of the semiconductor lasers 3r, 3g, 3b are electrically contactable without bond wires, they may be produced in a particularly compact and space-saving manner. For example, the width of the semiconductor bodies 30 is in each case at most 180 μm, in particular between 50 μm and 150 μm inclusive. In a longitudinal direction, the semiconductor bodies 30 extend for example for between 400 μm and 4000 μm inclusive. The thickness of the substrates 33 is preferably between 40 μm and 200 μm inclusive. The total thickness of the semiconductor lasers 3 preferably amounts to between 50 μm and 500 μm inclusive.

Figure 7:
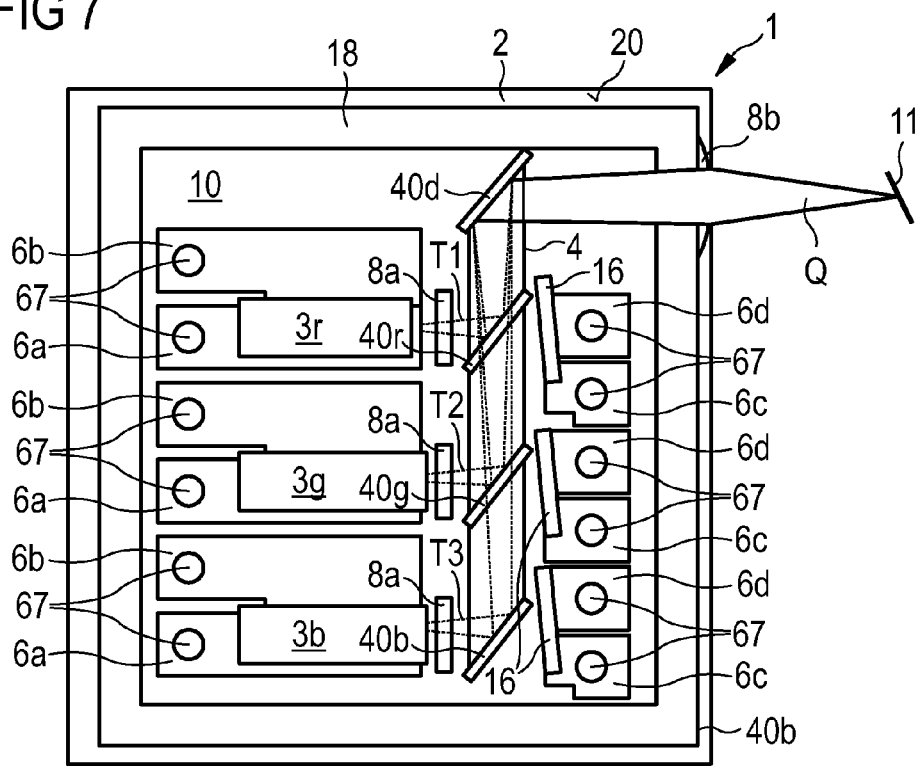

A further exemplary embodiment of the semiconductor laser light source 1 is shown in FIG. 7. Within the enclosure 10, the semiconductor laser light source 1 comprises three monitor diodes 16, which are each associated with one of the semiconductor lasers 3r, 3g, 3b. The monitor diodes 16 make it possible to perform colour balancing and to compensate power fluctuations of the semiconductor lasers 3r, 3g, 3b. The monitor diodes 7 are contacted electrically via the conductor tracks 6c, 6d on the carrier top 20. Like the conductor tracks 6a, 6b, the conductor tracks 6c, 6d are connected by way of the vias 67 to corresponding conductor tracks on the carrier bottom, not shown in FIG. 7.

According to FIG. 7, the optical component 4 is bar-shaped. Optical coatings 40r, 40g, 40b are incorporated into the optical component 4, these coatings each being reflective with regard to one of the partial beams T1, T2, T3 and transmissive with regard to the further partial beams. A small fraction of the radiation of the partial beams T1, T2, T3 penetrates through the coatings 40r, 40g, 40b to the monitor diodes 16. A further coating 40d, which is reflective for all the partial beams T1, T2, T3, brings about deflection of the whole beam Q towards the micro-electromechanical mirror 11. It is also possible for the semiconductor lasers 3r, 3g, 3b to emit differently polarised partial beams T1, T2, T3 and for the optical component 4 to be an element with polarization-selective action. Unlike in the illustration, the semiconductor laser source 1 in each case includes for example two semiconductor lasers, which emit at the same wavelength but with different polarization directions and are in each case combined by means of the optical component 4.

A lens 8a is optionally in each case arranged downstream of the semiconductor lasers 3r, 3g, 3b, said lens being located between the semiconductor lasers 3r, 3g, 3b and the optical component 4. However, the distance between the optical component 4 and the semiconductor lasers 3r, 3g, 3b is preferably small, for example at most 600 μm, at most 400 μm or at most 200 μm, such that it is possible to dispense with the lens 8a.

According to FIG. 7, the conductor tracks 6a, 6b on the carrier top 20 do not extend outside the enclosure 10, when the carrier top 20 is seen in plan view. The vias 67, when seen in plan view, are thus also located within the housing frame 18. This makes it possible to mount the housing frame 18, formed in particular of a metal, directly on the carrier top 20. A further lens 8b for focusing the whole beam Q is mounted on the housing frame 18 or on the cover 5 not shown in FIG. 7.

Figure 8:
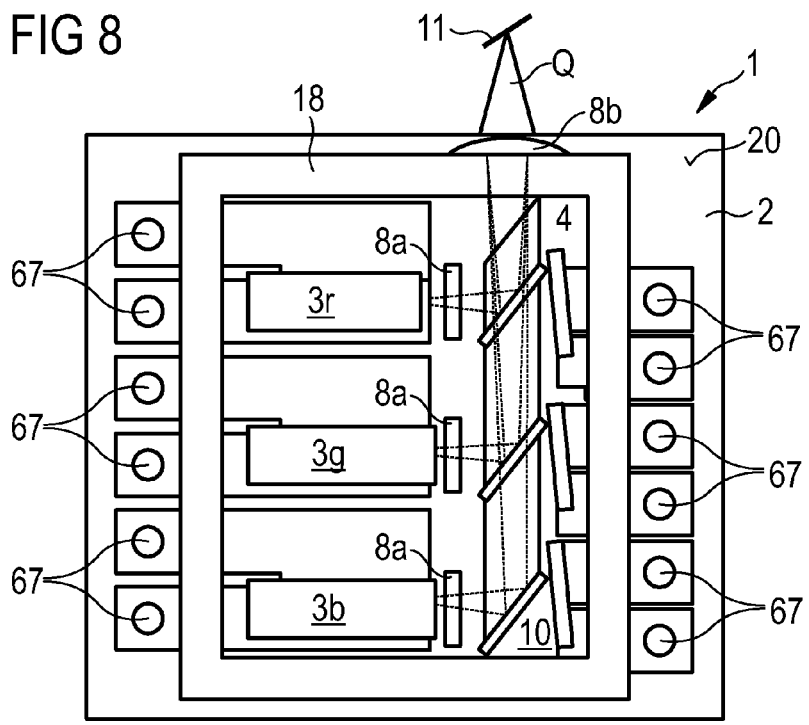

According to FIG. 8, once the partial beams have been combined, the optical component 4 do not deflect the whole beam Q again. In plan view of the carrier top 20, the conductor tracks 6a, 6b and the vias 67 are located outside the housing frame 18.

Figure 9:
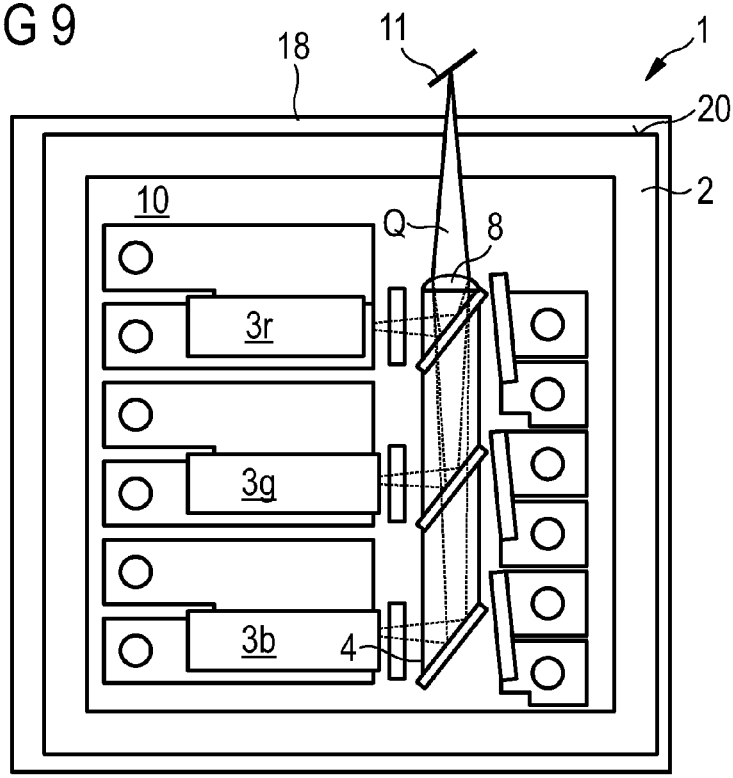

According to FIG. 9, the lens 8 is mounted on the optical component 4 and is located inside the enclosure 10.

Figure 10:
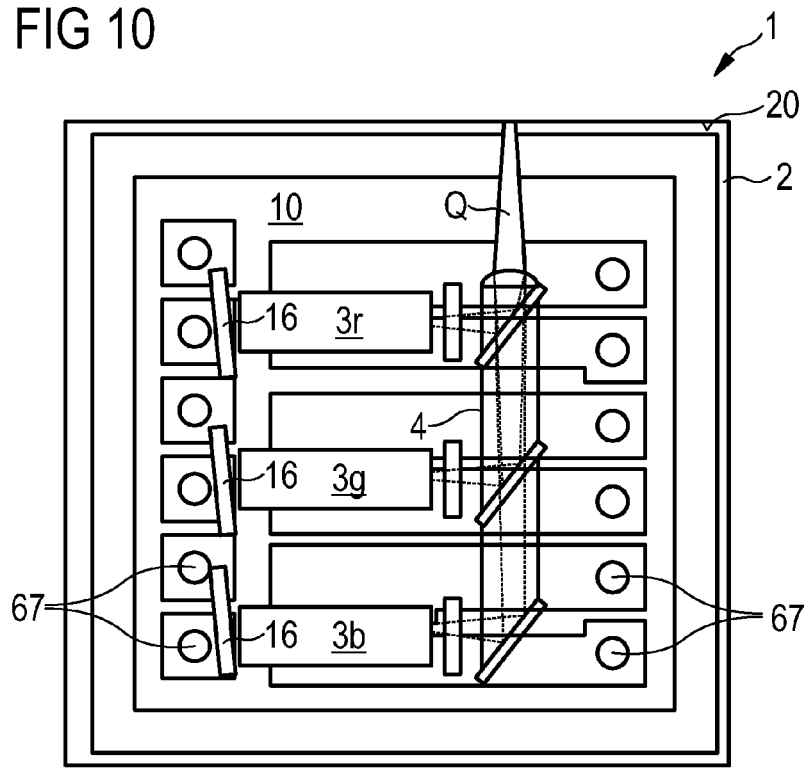

As also in the exemplary embodiment according to FIG. 9, according to FIG. 10 the conductor tracks and the vias 67 are arranged inside the housing frame 18, when the carrier top 20 is seen in plan view. The monitor diodes 16 are located on sides of the semiconductor lasers 3r, 3g, 3b remote from the optical component 4.

In the exemplary embodiment of the semiconductor laser light source 1 according to FIG. 11, see the sectional representation in FIG. 11A and the schematic plan view according to FIG. 11B, an application-specific integrated circuit 22, or ASIC for short, is mounted on the carrier bottom 25 for driving the semiconductor lasers 3r, 3g, 3b. The circuit 22 is used to drive the semiconductor lasers 3r, 3g, 3b and optionally to analyse the signals from the monitor diodes 16.

Figure 12:
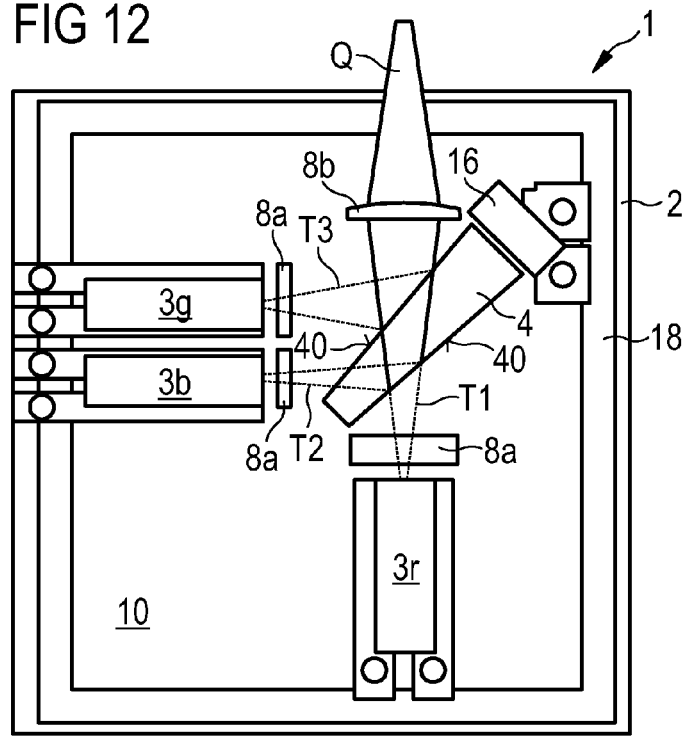

According to FIG. 12, the semiconductor laser light source 1 comprises an optical component 4 provided with optical coatings 40. The partial beam T1 of the semiconductor laser 3r is transmitted substantially unimpeded by the optical component 4. The partial beam T2 of the semiconductor laser 3b is reflected at a side facing the semiconductor laser 3r and deflected towards the lens 8b, which is arranged separately in the enclosure 10 from the optical component 4. The partial beam T3 of the semiconductor laser 3g is deflected towards the lens 8b at a major face of the optical component 4 remote from the semiconductor laser 3r via the coating 40. The lenses 8a located between the optical component 4 and the semiconductor lasers 3r, 3g, 3b are preferably dispensed with.

The monitor diode 16 is mounted indirectly or directly on the optical component 4 and, from the semiconductor lasers 3r, 3g, 3b, receives radiation fractions directed by the optical component 4 towards the monitor diode 16. The individual radiation outputs of the semiconductor lasers 3r, 3g, 3b are preferably determined during operation of just one of the semiconductor lasers 3r, 3g, 3b, for example if the whole beam Q is located outside an image field of an image to be displayed.

Figure 13:
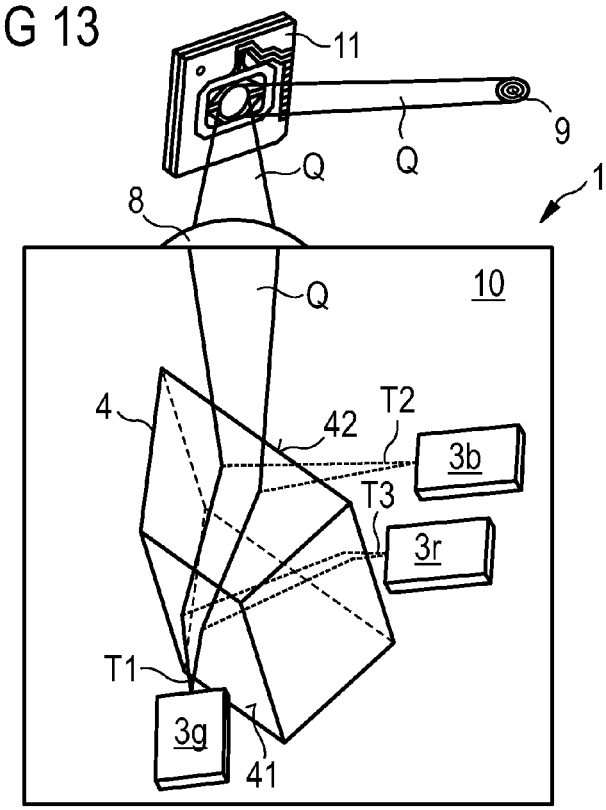

In the exemplary embodiment of the semiconductor laser light source 1 according to FIG. 13, the optical component 4 takes the form of a prism. A planar, first major face 41 of the optical component 4 faces the semiconductor laser 3g. The partial beam T1 of the semiconductor laser 3g impinges obliquely on the first major face 41, whereby refraction occurs at the major face 41. The partial beam T1 then passes through the optical component 4 and exits, likewise undergoing refraction, at the planar, second major face 42, and continues on to the lens 8 mounted outside the enclosure 10.

The semiconductor lasers 3r, 3b are arranged obliquely to the semiconductor laser 3g and face a second major face 42. The second major face 42 is oriented parallel to the first major face 41. The partial beam T3 of the semiconductor laser 3r enters the optical component 4 at the second major face 42 and is then reflected at the first major face 41. After reflection at the first major face 41, the partial beams T1, T3 extend congruently.

The partial beam T2 of the semiconductor laser 3b is reflected at the second major face 42 and, through this reflection, combined congruently with the partial beams T1, T3 to form the whole beam Q. The partial beams T2, T3 also impinge obliquely on the second major face 42. The major faces 41, 42 are provided with appropriately acting optical coatings, not shown in FIG. 13.

The distances between the semiconductor lasers 3r, 3g, 3b and the lens 8 are preferably adjusted such that the divergences, beam diameters and/or directions of the partial beams T1, T2, T3 are identical or approximately identical when they impinge on the lens 8, as indeed in all the other exemplary embodiments.

Figure 14:
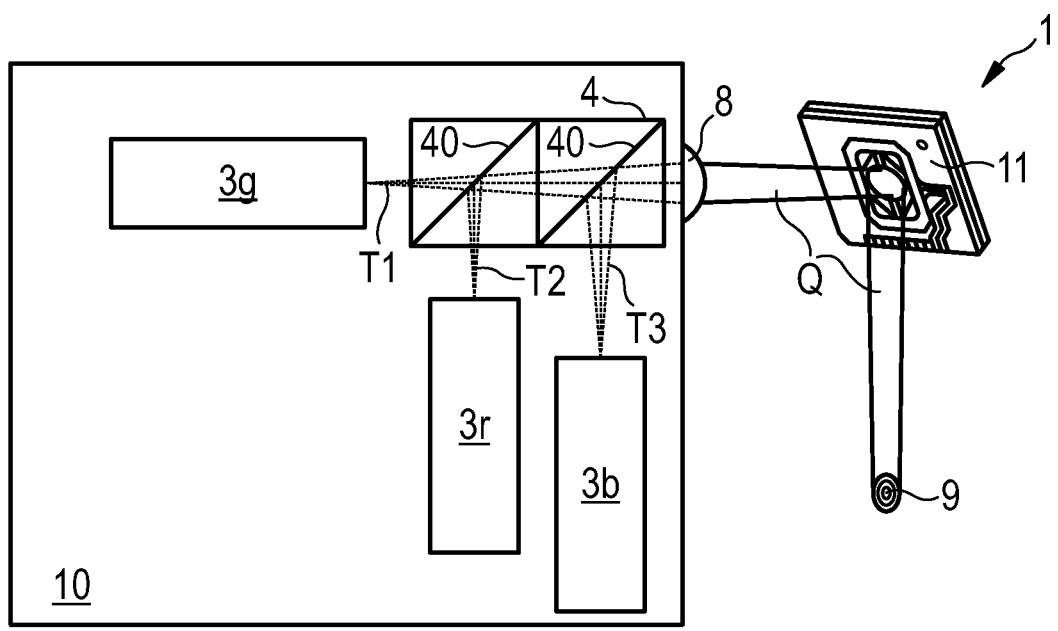

According to FIG. 14, the optical component 4 is of cuboid construction. Two optical coatings 40 are incorporated into the optical component 4, which coatings are transmissive with regard to the partial beam T1 of the semiconductor laser 3g and reflective with regard to the partial beams T2, T3 of the semiconductor lasers 3r, 3b. In one beam direction of the partial beam T1, the optical component 4 preferably extends by at most 800 μm, in particular by between 400 μm and 700 μm inclusive, in particular by around 600 μm. The dimensions of the enclosure 10 amount to 2 mm×2 mm, in plan view.

Unlike in FIG. 14, the semiconductor lasers 3g, 3r emit the partial beams T1, T2 at identical wavelengths, the partial beams T1, T2 being differently polarized. The partial beams T1, T2 are then combined for example in that the coating 40 located closer to the semiconductor laser 3g reflects the partial beam T2 with a first polarization direction and transmits the partial beam T1 with a second polarization direction. In other words, the optical component 4 then also constitutes a polarization-selective element.

The semiconductor laser light source 1, as shown in FIG. 15, comprises a plurality of integrated circuits 22a, 22b, 22c, which are in each case connected together and to external components, not shown, via electrical lines 23. The circuits 22a, 22b, 22c and the carrier 2 with the semiconductor lasers 3 are mounted on the top of a mounting support 50, the semiconductor lasers 3 emitting the partial beams T1, T2, T3 parallel to a major face of the mounting support 50. The circuits 22a, 22b, 22c comprise for example an electronic driver for the imaging optical system, driver electronics for the semiconductor laser 3 and/or a video signal processing unit. Unlike in the illustration, the circuits 22a, 22b, 22c may also be mounted directly on the carrier 2.

The housing frame 18 has a thickness, for example, of between 0.1 mm and 2.0 mm inclusive, preferably between 0.15 mm and 0.5 mm inclusive, in particular around 300 μm. If, as in FIG. 15, the housing frame also serves in outcoupling the whole beam Q, the housing frame is formed for example with a glass and provided with an antireflective coating, at least in a region in which the whole beam Q passes through the housing frame 18.

The semiconductor laser light source 1 preferably comprises at least one of two proximity sensors 13a, 13b. The proximity sensor 13b comprises a semiconductor light source 15, for example a light-emitting diode emitting in the near infrared spectral range. The semiconductor light source 15 illuminates a field of view 150, which substantially covers an image field of the image 9 generated by the micro-electromechanical mirror 11.

If there is an object in the field of view 150, radiation emitted by the semiconductor light source 15 is reflected back towards the monitor diode 16b. Safety electronics 14, for example integrated in the circuit 22a, are then capable of reducing the power of the semiconductor laser 3r, 3b, 3g, so as to prevent risk for example to the human eye in the field of view 150.

The proximity sensor 13a is shown in greater detail in FIGS. 15B and 15C. The micro-electromechanical mirror 11 is suspended and mounted in mobile manner on mirror supports 110a, 110b. The monitor diodes 16c, 16d are mounted in pairs on the mirror support 110b, the signals from said monitor diodes being analysed in pairs via the electrical lines 23c, 23d, for example via difference amplifiers. The monitor diodes 16c, 16d are located, cf. FIG. 15B, on the rear of the mirror supports 110a, 110b remote from the optical component 4.

This arrangement makes it possible for the monitor diodes 16c, 16d to detect some of the whole beam Q, which is reflected back from an object in the further beam path of the whole beam Q towards the micro-electromechanical mirror 11. By analysing the signals of the monitor diodes 16c, 16d for instance with the assistance of difference amplifiers, it is thus possible to determine whether an object is located in the beam path of the whole beam Q. The power of the semiconductor lasers 3r, 3g, 3b may then be reduced by way of the safety control electronics 14. The monitor diodes 16c, 16d are based on silicon, for example.

Figure 16:
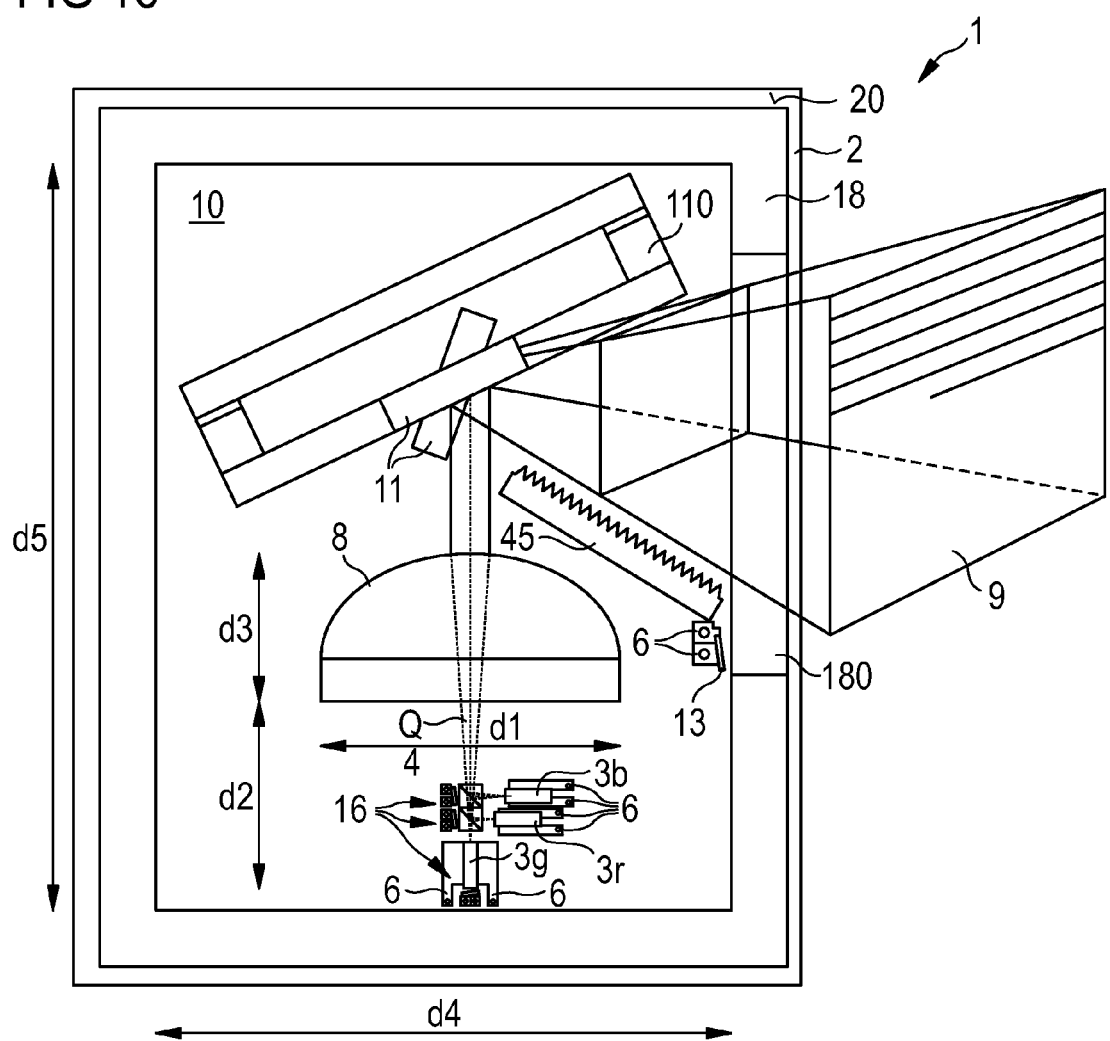

In the exemplary embodiment of the semiconductor laser light source 1 according to FIG. 16, unlike in FIG. 15, the imaging optical system, preferably in the form of a micromechanical mirror 11, and the lens 8 are likewise accommodated in the enclosure 10. The housing frame 18 is provided with a window 180, through which the whole beam Q leaves the enclosure 10. Also located in the enclosure is the proximity sensor 13. The monitor diodes 16 are also located in the enclosure 10. Two of the monitor diodes 16 are mounted on a side of the optical component 4 remote from the associated semiconductor laser 3b, 3r, a further one of the monitor diodes 16 being arranged in a manner similar to FIG. 10, like the semiconductor lasers 3r, 3g, 3b. Electrical interconnection proceeds for example in a manner similar to FIG. 3 or FIG. 11. The cover 5 is not shown in FIG. 16.

Unlike in the illustration and indeed as in all the other exemplary embodiments, the lens 8 may comprise an optical system with a plurality of lenses. In particular, due to the optical system the whole beam has a comparatively large beam diameter at the mirror 11 or is magnified by the optical system upstream of the mirror 11. The beam diameter and/or a divergence are then preferably not reduced until after the mirror 11. In other words, the imaging optical system may be located between individual ones of the then multiple lenses 8.

A beam dump 45 is optionally located in the enclosure 10, in particular between the window 180 and the semiconductor lasers 3b, 3r, 3g and/or the monitor diodes 16 and/or the proximity sensor 13. By way of the beam dump, a proportion of the whole beam Q reflected at the window 180 or light entering through the window 180 is at least partially kept away in particular from the monitor diodes 16 and/or from the proximity sensor 13.

The enclosure 10 is preferably evacuated. This allows the micro-electromechanical mirror 11 to move at high speeds. In addition, the semiconductor laser light source 1 is free of an additional vacuum chamber for the micro-electromechanical mirror 11, whereby reflection losses at windows of such a vacuum chamber likewise do not occur.

A width d1 of a radiation entrance face of the lens 8 is for example between 0.5 mm and 4.0 mm inclusive, in particular around 2 mm. A height d3 of the lens 8, parallel to a beam axis of the whole beam Q in the lens 8, is in particular between 0.5 mm and 2.0 mm inclusive, preferably around 1.0 mm. A distance d2 between the monitor diode 16 associated with the semiconductor laser 3g and the radiation entrance face of the lens 8 is preferably between 0.5 mm and 2.0 mm inclusive or between 0.75 mm and 1.5 mm inclusive, for example around 1.25 mm. The internal dimensions d4, d5 of the enclosure 10 amount to around 4 mm×5.5 mm, while the external dimensions of the carrier 2 are less than 8 mm×8 mm, in particular around 4.5 mm×6 mm. The total height of the semiconductor laser light source 1 is less than 4 mm, while the enclosure 10 preferably measures at most 100 mm$^3$.

FIG. 17 shows a conventional laser light source 1'. The perspective representation according to FIG. 17A shows the cover 5, mounted on a mounting support 50. According to FIG. 17B, the cover 5 is removed, cf. also the plan view in FIG. 17C. The semiconductor body 30 of the semiconductor laser 3' is contacted electrically via the bonding wires 19. One of the bonding wires 19 extends to the surface metallization 32, and a further one of the bonding wires extends to the conductor track 6. Such a structure of the semiconductor laser 3' has a comparatively large space requirement.

Figure 18:
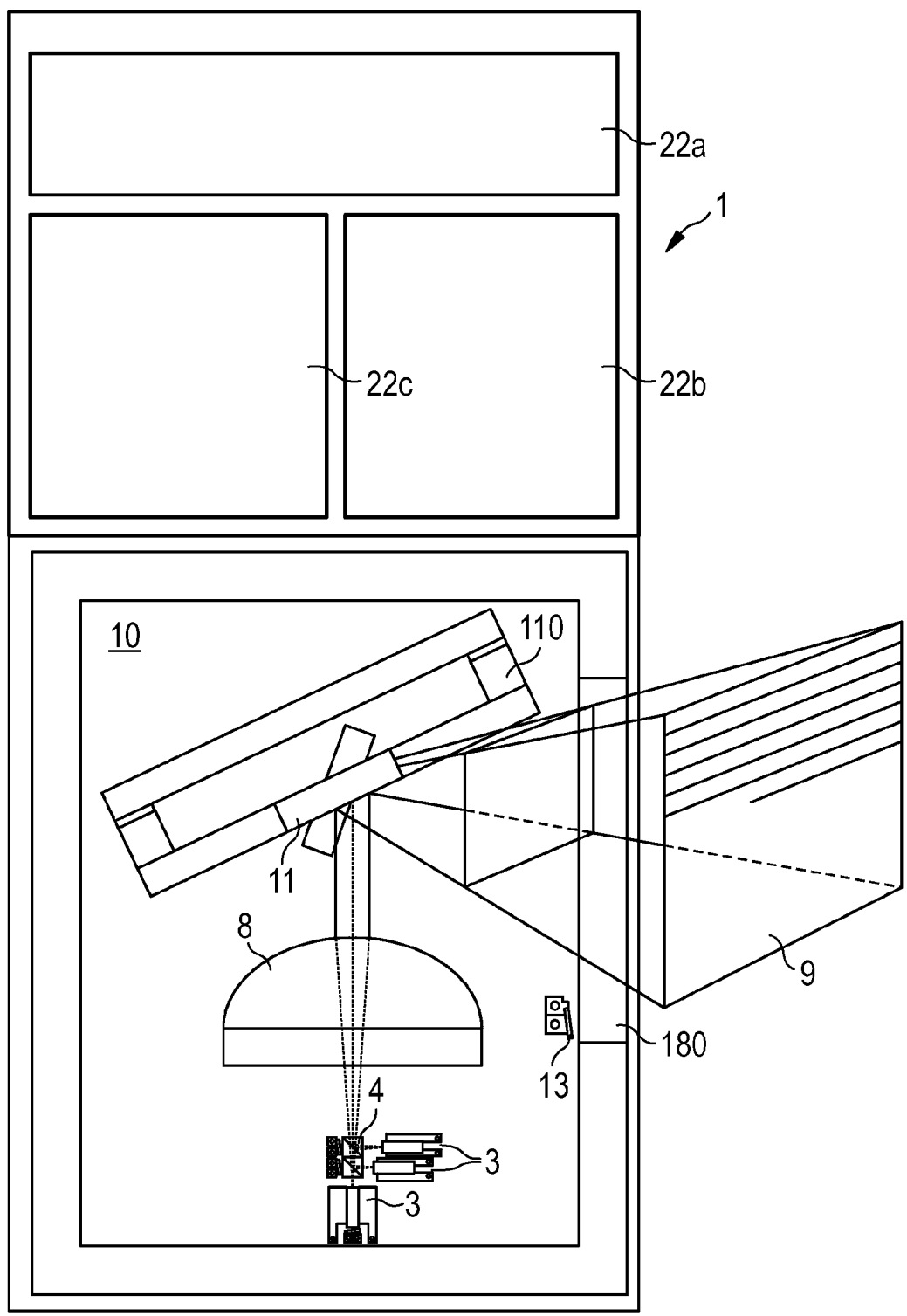
Figure 18:
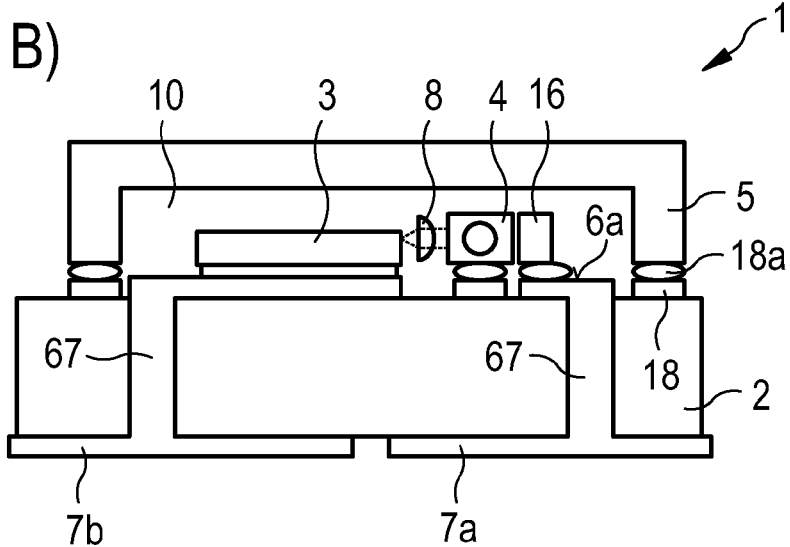

The semiconductor laser light source 1 according to the plan view in FIG. 18A and the sectional representation in FIG. 18B corresponds, with regard to beam guidance and the optical structure, substantially to the semiconductor light source 1 according to FIG. 16 and with regard to electrical contacting substantially to the semiconductor light source 1 according to FIG. 11A. In addition, the semiconductor light source 1 comprises an in particular digital ASIC 22a for receiving a video signal and in particular analogue ASICs 22b, 22c, which may include digital/analogue converters, for driving the micro-electromechanical mirror 11 and for driving the semiconductor lasers 3. The ASICs 22a, 22b, 22c are mounted outside and mounted next to the cover 5, cf. also FIG. 15A. The proximity sensor 13 and/or an ambient luminosity sensor 13 is optionally mounted in the enclosure 10, as indeed in all the other exemplary embodiments.

Figure 19:
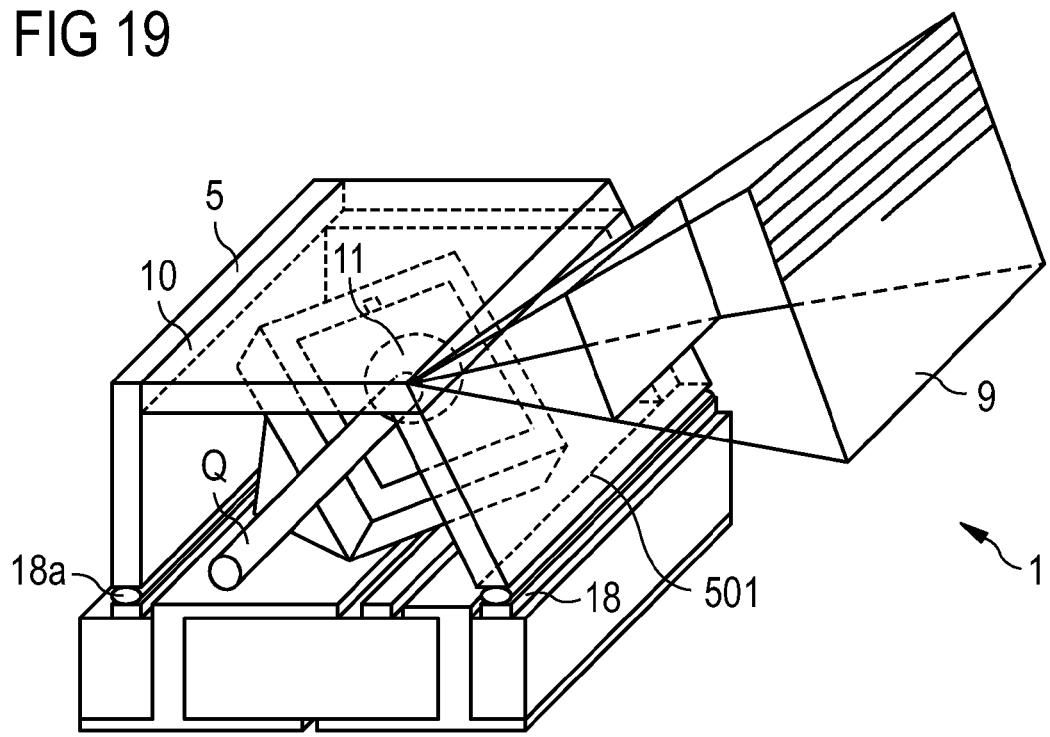

FIGS. 19 and 20B are perspective representations of the semiconductor light source 1 and of the cover 5 therefor. The cover 5 comprises a light outlet panel 501, through which, in operation, the whole beam Q leaves the semiconductor light source 1 after reflection at the micro-electromechanical mirror 11 located inside the cover 5. The light outlet panel 501 is preferably provided locally or over its entire surface with an anti-reflective coating, for example with a broadband anti-reflective coating for the spectral range of 420 nm to 660 nm.

The light outlet panel 501, a lid panel 502, side panels 503 and a rear panel 504 are preferably made from the same material, wherein the light outlet panel 501 may be of relatively high optical quality. The stated components are preferably made from a glass, which is adapted to the carrier 2 with regard to coefficient of thermal expansion. For example, the coefficients of thermal expansion of the components of the cover 5 and of the carrier 2 differ from one another by at most 25% or by at most 10% or by at most 5%. The carrier 2 is here preferably made from aluminium nitride.

The cover 5 is adhesively bonded or soldered to the frame 18 or directly to the carrier 2, such that the enclosure 10 is sealed. The individual components of the cover 5 are for example adhesively bonded to one another or made in one piece. The thicknesses of the components are in particular between 0.4 mm and 1.6 mm inclusive, for example the thickness L2 amounts to around 0.5 mm and the thickness L5 to around 1.0 mm. The length L3 amounts in particular to between 2 mm and 8 mm inclusive, preferably around 5 mm. The length L1 amounts in particular to between 3 mm and 9 mm inclusive, preferably around 6 mm. The length L4 amounts in particular to between 2 mm and 6 mm inclusive, preferably around 4 mm. An angle α between the carrier 2 and the light outlet panel 501 is preferably between 60° and 75° inclusive, for example around 67.5°.

FIG. 20A is a schematic plan view of a carrier assembly 200, or wafer. The carrier assembly 200 is for example an aluminium nitride wafer with a diameter of around 102 mm or around 152 mm, on which the semiconductor lasers 3 are mounted and contacted. The covers 5, for instance according to FIG. 20B, may be fitted to the carrier assembly 200 under protective gas or in a vacuum after adjustment of the optics, but before singulation of the wafer 200 into individual semiconductor light sources 1. Production of the semiconductor light sources 1 then proceeds entirely in the carrier assembly 200, i.e., at wafer level.

The invention described herein is not restricted by the description given with reference to the exemplary embodiments. Rather, the invention encompasses any novel feature and any combination of features, including in particular any combination of features in the claims, even if this feature or this combination is not explicitly indicated in the claims or exemplary embodiments.

The invention claimed is:

1. A semiconductor laser light source comprising:
a carrier with a carrier top,
a plurality of semiconductor lasers, the semiconductor lasers being mounted on the carrier top,
at least one optical component arranged downstream of at least one of the semiconductor lasers in a direction of emission wherein the optical component is designed to superimpose partial beams emitted by the semiconductor lasers and to bring them together into a whole beam, and
a cover, overlying the semiconductor lasers and the optical component such that the semiconductor lasers and the optical component are housed tightly in a common housing and the dimensions of an enclosure containing the semiconductor lasers and the optical component amount to at most 8 mm×8 mm×7 mm, wherein each of the semiconductor lasers is contacted electrically and mechanically without bonding wire with two respective electrical conductor tracks on the carrier top.

2. The semiconductor laser light source according to claim 1, wherein the optical component is arranged jointly and directly optically downstream of the semiconductor lasers.

3. The semiconductor laser light source according to claim 1, wherein the optical semiconductor lasers are designed to emit radiation of the same wavelength and with different polarization directions, and the radiation form the lasers being superimposed by the optical component to form a common beam.

4. The semiconductor laser light source according to claim 1, wherein the optical component does not reduce divergence of the partial beams or of the whole beam, and wherein the semiconductor laser light source further comprises a lens arranged downstream of the optical component.

5. The semiconductor laser light source according to claim 1, wherein the semiconductor laser light source is mechanically and/or electrically surface-mountable, and wherein, when viewed in plan view, each semiconductor laser extends over at least two electrical conductor tracks on the carrier top.

6. The semiconductor laser light source according to claim 1, wherein the electrical conductor tracks on the carrier top are electrically connected to corresponding conductor tracks on a carrier bottom that is opposite the carrier top and wherein the conductor tracks on the carrier bottom are designed for surface mounting of the semiconductor light source.

7. The semiconductor laser light source according to claim 1, further comprises an imaging optical system mounted on the carrier top.

8. The semiconductor laser light source according to claim 7, further comprising:
a proximity sensor on the carrier top, the proximity sensor designed to detect an object in an image field of the semiconductor laser light source, and
safety control electronics designed to reduce output power of the semiconductor lasers as a function of a signal from the proximity sensor, and
wherein the proximity sensor is located on the back of the imaging optical system, the back being opposite a front of the imaging optical system, wherein the front reflects the whole beam.

9. The semiconductor laser light source according to claim 8, further comprising driver electronics for the semiconductor lasers, an electronic driver for the imaging optical system and a video signal processing unit located on the carrier top and/or on a mounting support on which the carrier is mounted.

10. The semiconductor laser light source according to claim 8, wherein the proximity sensor detects part of the whole beam reflected by the object.

11. The semiconductor laser light source according to claim 1, further comprising precisely one monitor diode, designed for active power readjustment of the semiconductor lasers, the diode being mounted on the optical component, a fraction of each of partial beams emitted by the semiconductor lasers is guided through the optical component to the monitor diode.

12. A semiconductor laser light source comprising:
a carrier with a carrier top,
a plurality of semiconductor lasers, the semiconductor lasers being mounted on the carrier top,
at least one optical component arranged downstream of at least one of the semiconductor lasers in a direction of emission wherein the optical component is designed to superimpose partial beams emitted by the semiconductor lasers and to bring them together into a whole beam, and
a cover, overlying the semiconductor lasers and the optical component such that the semiconductor lasers and the optical component are housed tightly in a common housing and the dimensions of an enclosure containing the semiconductor lasers and the optical component amount to at most 8 mm×8 mm×7 mm, wherein at least one of the semiconductor lasers comprises a semiconductor body that comprises top face metallization on a major face remote from the carrier top, which metallization extends at least 50% of the way along a longitudinal direction of the semiconductor body, wherein the top face metallization is connected conductively via side face metallization, which is applied to a longitudinal side of the semiconductor body, to one of the electrical conductor tracks on the carrier top.

13. A semiconductor laser light source comprising:
a carrier with a carrier top,
a plurality of semiconductor lasers, the semiconductor lasers being mounted on the carrier top,
at least one optical component arranged downstream of at least one of the semiconductor lasers in a direction of emission wherein the optical component is designed to superimpose partial beams emitted by the semiconductor lasers and to bring them together into a whole beam, and
a cover, overlying the semiconductor lasers and the optical component such that the semiconductor lasers and the optical component are housed tightly in a common housing and the dimensions of an enclosure containing the semiconductor lasers and the optical component amount to at most 8 mm×8 mm×7 mm, wherein at least one of the semiconductor lasers comprises a semiconductor body that comprises top face metallization on a major face remote from the carrier top, wherein the metallization extends at least 50% of the way along a longitudinal direction of the semiconductor body, wherein the top face metallization is connected conductively by way of vias through the semiconductor body to an electrical conductor track on the carrier top.

14. The semiconductor laser light source according to claim 7, wherein a lens, the imaging optical system and a monitor diode are arranged in the enclosure.

15. A semiconductor laser light source comprising:
a carrier with a carrier top,
a plurality of semiconductor lasers mounted on the carrier top,
conductor tracks on the carrier top,
an optical component arranged downstream of at least one of the semiconductor lasers in a direction of emission, and
a cover, wherein the semiconductor lasers and the optical component are housed tightly in a common enclosure by the cover, wherein the dimensions of the enclosure amount to at most 8 mm×8 mm×7 mm,
wherein the optical component is designed to superimpose partial beams emitted by the semiconductor lasers and to bring them together into a whole beam,
wherein each of the semiconductor lasers is contacted electrically and mechanically without bonding wire to at least two corresponding electrical conductor tracks on the carrier top,
wherein each semiconductor laser overlaps partially with its respective conductor track,
wherein the optical component is arranged jointly and directly optically downstream of all of the semiconductor lasers, and
wherein a distance between the optical component and the semiconductor lasers is at most 600 μm.

16. A semiconductor laser light source according to claim 15, wherein the semiconductor laser light source comprises three the semiconductor lasers, wherein the optical component comprises a prism, wherein a planar, first major face of the optical component faces a first one of the semiconductor lasers, wherein the remaining semiconductor lasers are arranged obliquely to the first semiconductor laser and face a planar, second major face of the optical component, and wherein the second major face is oriented parallel to the first major face.

17. The semiconductor laser light source according to claim 7, wherein the imaging optical system comprises a micro-electromechanical mirror designed for projection of the whole beam to form a time-variable image.

18. The semiconductor laser light source according to claim 7, wherein the imaging optical system comprises a diffractive optical element, which is designed for projection of the whole beam to form a time-invariable image.

19. The semiconductor laser light source according to claim 8, wherein the proximity sensor comprises a semiconductor light source emitting in the near infrared spectral range and detects a part of this emitted radiation reflected by the object.

20. A semiconductor laser light source comprising:
a carrier with a carrier top,
a plurality of semiconductor lasers, the semiconductor lasers being mounted on the carrier top,
at least one optical component arranged downstream of at least one of the semiconductor lasers in a direction of emission wherein the optical component is designed to superimpose partial beams emitted by the semiconductor lasers and to bring them together into a whole beam, wherein the optical semiconductor lasers are designed to emit radiation of the same wavelength and with different polarization directions, and the radiation form the lasers being superimposed by the optical component to form a common beam, and
a cover, overlying the semiconductor lasers and the optical component such that the semiconductor lasers and the optical component are housed tightly in a common housing and the dimensions of an enclosure containing the semiconductor lasers and the optical component amount to at most 8 mm×8 mm×7 mm.

\* \* \* \* \*

UNITED STATES PATENT AND TRADEMARK OFFICE
CERTIFICATE OF CORRECTION

| | | |
|---|---|---|
| PATENT NO. | : 8,855,155 B2 | Page 1 of 1 |
| APPLICATION NO. | : 13/579209 | |
| DATED | : October 7, 2014 | |
| INVENTOR(S) | : Stephan Lutgen et al. | |

It is certified that error appears in the above-identified patent and that said Letters Patent is hereby corrected as shown below:

In the Claims,

In Col. 14, line 7, claim 3, delete "radiation form" and insert --radiation from--.
In Col. 16, line 14, claim 16, delete "three the semiconductor" and insert --three of the semiconductor--.
In Col. 16, line 46, claim 20, delete "radiation form" and insert --radiation from--.

Signed and Sealed this
Thirty-first Day of March, 2015

Michelle K. Lee
*Director of the United States Patent and Trademark Office*